(12) United States Patent
Hsieh et al.

(10) Patent No.: US 11,158,586 B2
(45) Date of Patent: Oct. 26, 2021

(54) SEMICONDUCTOR STRUCTURE AND MANUFACTURING METHOD THEREOF

(71) Applicant: NANYA TECHNOLOGY CORPORATION, New Taipei (TW)

(72) Inventors: Chang-Chun Hsieh, Huatan Township, Changhua County (TW); Wu-Der Yang, Taoyuan (TW); Ching-Feng Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 100 days.

(21) Appl. No.: 16/386,816

(22) Filed: Apr. 17, 2019

(65) Prior Publication Data

US 2020/0211979 A1 Jul. 2, 2020

Related U.S. Application Data

(60) Provisional application No. 62/785,504, filed on Dec. 27, 2018.

(51) Int. Cl.
| | |
|---|---|
| *H01L 23/31* | (2006.01) |
| *H01L 23/552* | (2006.01) |
| *H01L 23/498* | (2006.01) |
| *H01L 23/00* | (2006.01) |
| *H01L 23/16* | (2006.01) |

(52) U.S. Cl.
CPC ............ *H01L 23/552* (2013.01); *H01L 23/16* (2013.01); *H01L 23/3128* (2013.01); *H01L 23/49838* (2013.01); *H01L 24/32* (2013.01); *H01L 24/48* (2013.01); *H01L 2224/32225* (2013.01); *H01L 2224/48227* (2013.01)

(58) Field of Classification Search
CPC combination set(s) only.
See application file for complete search history.

(56) References Cited

U.S. PATENT DOCUMENTS

| | | |
|---|---|---|
| 5,436,203 A | 7/1995 | Lin |
| 6,150,193 A | 11/2000 | Glenn |
| 6,962,829 B2 | 11/2005 | Glenn et al. |
| 8,199,518 B1 | 6/2012 | Chun et al. |

(Continued)

FOREIGN PATENT DOCUMENTS

CN 109256371 A 1/2019

OTHER PUBLICATIONS

Office Action dated Jul. 14, 2020 related to Taiwanese Application No. 108126678.

(Continued)

*Primary Examiner* — Moin M Rahman
(74) *Attorney, Agent, or Firm* — Muncy, Geissler, Olds & Lowe, P.C.

(57) ABSTRACT

The present disclosure relates to a semiconductor structure and a method of manufacturing the semiconductor structure. The semiconductor structure includes a substrate including a first surface and a conductive trace extending over the substrate; a die disposed over the first surface of the substrate; a molding disposed over the first surface of the substrate and covering the die; and a metallic layer surrounding the molding and the substrate, wherein the metallic layer is electrically connected to at least a portion of the conductive trace exposed through the substrate.

7 Claims, 33 Drawing Sheets

(56) References Cited

U.S. PATENT DOCUMENTS

| | | |
|---|---|---|
| 8,839,508 B2 | 9/2014 | Sanjuan et al. |
| 2008/0111233 A1* | 5/2008 | Pendse .................... H01L 21/56 |
| | | 257/712 |
| 2013/0026658 A1 | 1/2013 | Chen |
| 2017/0005042 A1* | 1/2017 | Chen ..................... H01L 23/552 |
| 2017/0186698 A1* | 6/2017 | Dimayuga ............ H01L 21/563 |
| 2017/0243858 A1* | 8/2017 | Chou ....................... H01L 25/03 |
| 2019/0103365 A1* | 4/2019 | Singh ...................... H01L 25/16 |

OTHER PUBLICATIONS

Office Action dated Oct. 30, 2020 related to Taiwanese Application No. 108126678.
Office Action dated May 7, 2021 in CN Application No. 210911347790.X, 13 pages.

* cited by examiner

SEMICONDUCTOR STRUCTURE AND MANUFACTURING METHOD THEREOF

PRIORITY CLAIM AND CROSS-REFERENCE

This application claims the priority benefit of U.S. provisional application Ser. No. 62/785,504 filed on Dec. 27, 2018. The entirety of the above-mentioned patent application is hereby incorporated by reference herein and made a part of this specification.

TECHNICAL FIELD

The present disclosure relates to a semiconductor structure, and particularly relates to a metallic coating for shielding a die or a package in the semiconductor structure. Further, the present disclosure relates to a method of manufacturing the semiconductor structure comprising the metallic coating covering the die or the package.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functions are integrated and packaged into a single module. Furthermore, numerous manufacturing operations are implemented for integration of various types of semiconductor devices.

However, the manufacturing and integration of semiconductor devices involve many complicated steps and operations. Integration of semiconductor devices in low-profile and high-density configurations becomes increasingly complicated. An increase in complexity of manufacturing and integration of the semiconductor devices may cause deficiencies such as poor electrical interconnection, delamination of components, interference, etc.

Accordingly, there is a continuous need to improve the structure and the manufacturing of semiconductor devices.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising a substrate including a first surface and a conductive trace extending over the substrate; a die disposed over the first surface of the substrate; a molding disposed over the first surface of the substrate and covering the die; and a metallic layer surrounding the molding and the substrate, wherein the metallic layer is electrically connected to at least a portion of the conductive trace exposed through the substrate.

In some embodiments, the portion of the conductive trace is exposed through a sidewall of the substrate.

In some embodiments, the conductive trace and the metallic layer are connected to an electrical ground.

In some embodiments, the portion of the conductive trace is in contact with the metallic layer.

In some embodiments, the metallic layer is conformal to an outer surface of the molding and a sidewall of the substrate.

In some embodiments, the die is attached to the first surface of the substrate by an adhesive.

In some embodiments, the die is electrically connected to the substrate by a bonding wire.

In some embodiments, the semiconductor structure further comprises a conductive bump disposed over a second surface of the substrate opposite to the first surface.

Another aspect of the present disclosure provides a semiconductor structure comprising a substrate including a first surface and a conductive trace extending over the substrate; a die disposed over the first surface of the substrate; an insulating layer disposed over the first surface of the substrate and surrounding the die; a metallic layer disposed over the insulating layer and surrounding the die; and a molding disposed over the first surface of the substrate and covering the die, wherein the metallic layer is electrically connected to at least a portion of the conductive trace exposed through the first surface of the substrate.

In some embodiments, the portion of the conductive trace is exposed through the insulating layer.

In some embodiments, the conductive trace and the metallic layer are electrically connected to an electrical ground.

In some embodiments, the die is electrically connected to the substrate by a bonding wire coated by the insulating layer.

In some embodiments, the die is covered by the insulating layer, the metallic layer and the molding.

In some embodiments, the metallic layer is disposed conformal to the insulating layer.

Another aspect of the present disclosure provides a semiconductor structure comprising a substrate including a first surface and a conductive trace extending over the substrate; a die disposed over the first surface; an insulating layer disposed over the first surface of the substrate and covering the die; and a molding disposed over the first surface of the substrate and covering the die, wherein the molding is conductive and is electrically connected to at least a portion of the conductive trace exposed through the first surface of the substrate.

In some embodiments, the molding includes molding compound and metallic particles.

In some embodiments, the molding is in contact with the portion of the conductive trace.

In some embodiments, the portion of the conductive trace is exposed through the insulating layer.

In some embodiments, the conductive trace and the molding are electrically connected to an electrical ground.

In some embodiments, the molding includes carbon particles.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor device is manufactured by several processes. During fabrication of the semiconductor device, several electrical components with different functionalities and dimensions are assembled and integrated. However, each of the electrical components may generate electromagnetic radiation, which may undesirably interfere with other components. Furthermore, the semiconductor device may also generate electromagnetic radiation upon operation, and thus a performance of another adjacent semiconductor device may be adversely affected.

In the present disclosure, a semiconductor structure is disclosed. The semiconductor structure includes a substrate including a first surface and a conductive trace extending over the substrate; a die disposed over the first surface of the substrate; a molding disposed over the first surface of the substrate and covering the die; and a metallic layer surrounding the molding and the substrate, wherein the metallic layer is electrically connected to at least a portion of the conductive trace exposed through the substrate. The metallic layer is electrically connected to an electrical ground and thus is provided for shielding the die from electromagnetic interference. Therefore, an operation of the semiconductor structure can be improved.

Figure 1:
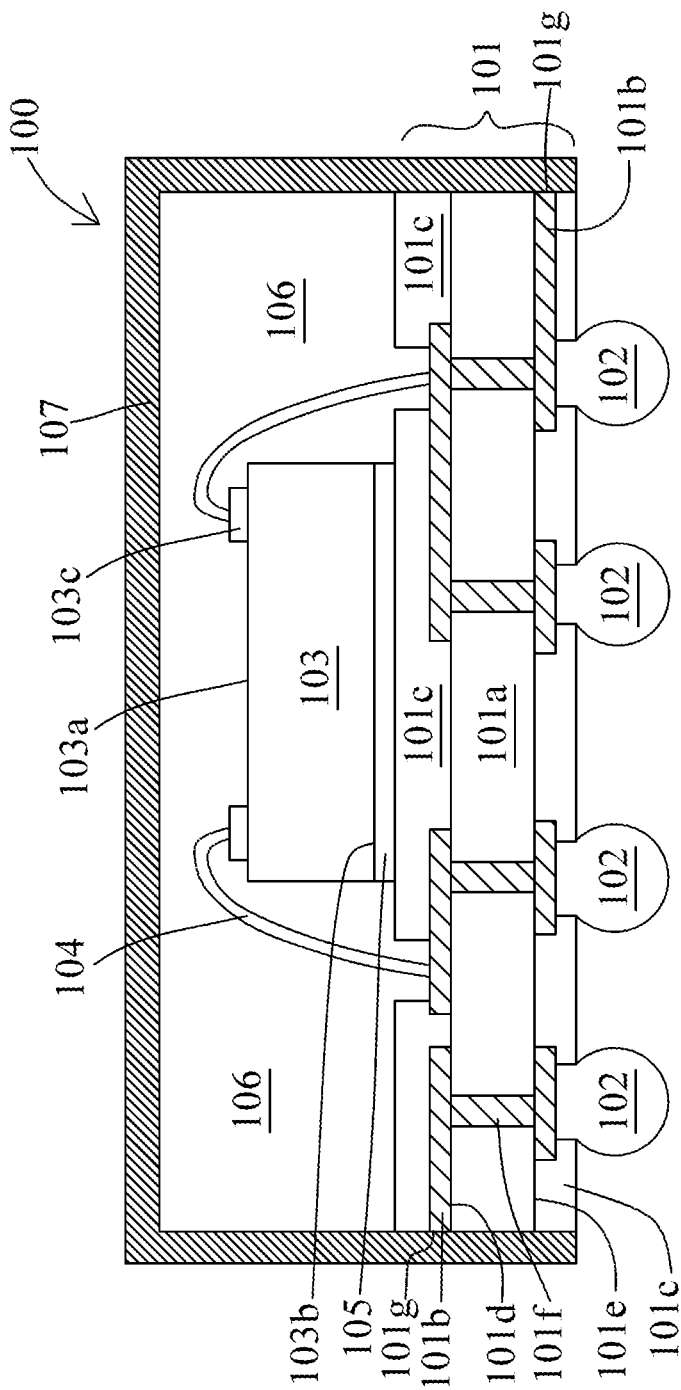
FIG. 1 is a schematic cross-sectional view of a first semiconductor structure in accordance with some embodiments of the present disclosure.

FIG. 1 is a schematic cross-sectional view of a first semiconductor structure 100 in accordance with some embodiments of the present disclosure. In some embodiments, the first semiconductor structure 100 is a semiconductor package or a part of the semiconductor package. In some embodiments, the first semiconductor structure 100 is a plastic ball grid array (PBGA) package, a fine pitch ball grid array (FBGA) package, or the like.

In some embodiments, the first semiconductor structure 100 includes a packaging substrate 101. In some embodiments, the packaging substrate 101 includes a substrate 101*a*, a conductive trace 101*b* and a protective layer 101*c*.

In some embodiments, the substrate 101*a* is a semiconductive substrate. In some embodiments, the substrate 101*a* is a packaging substrate. In some embodiments, the substrate 101*a* includes semiconductive material such as silicon, germanium, gallium, arsenic, and combinations thereof. In some embodiments, the substrate 101a includes material such as ceramic, glass or the like.

In some embodiments, the substrate 101a is fabricated with a predetermined functional circuit thereon. In some embodiments, the substrate 101a includes several conductive traces and several electrical components such as transistor, diode, etc. connected by the conductive traces and disposed within the substrate 101a.

In some embodiments, the substrate 101a includes a first surface 101d and a second surface 101e opposite to the first surface 101d. In some embodiments, the substrate 101a has a quadrilateral, rectangular, square, polygonal or any other suitable shape.

In some embodiments, the conductive trace 101b extends over the substrate 101a. In some embodiments, the conductive trace 101b extends into the substrate 101a. In some embodiments, the conductive trace 101b extends over the first surface 101d or the second surface 101e of the substrate 101a. In some embodiments, the conductive trace 101b includes copper, tungsten, aluminum, palladium or alloys thereof.

In some embodiments, the packaging substrate 101 further includes a conductive via 101f extending through the substrate 101a. In some embodiments, the conductive via 101f extends between the first surface 101d and the second surface 101e of the substrate 101a. In some embodiments, the conductive via 101f is electrically connected to the conductive trace 101b. In some embodiments, the conductive via 101f includes gold, silver, copper, nickel, tungsten, aluminum, palladium or alloys thereof.

In some embodiments, the protective layer 101c is disposed over the substrate 101a and at least partially covers the conductive trace 101b. In some embodiments, the protective layer 101c is disposed over the first surface 101d and the second surface 101e of the substrate 101a. In some embodiments, a portion of the conductive trace 101b is exposed through the protective layer 101c. In some embodiments, the protective layer 101c is a solder mask layer. In some embodiments, the protective layer 101c includes epoxy, polyimide, polybenzoxazole (PBO) or the like.

In some embodiments, the exposed portion of the conductive trace 101b is configured to receive a conductive structure such as a conductive bump, a conductive pad or the like. In some embodiments, the exposed portion of the conductive trace 101b is electrically connected to a conductive bump 102. In some embodiments, the conductive bump 102 is disposed over the exposed portion of the conductive trace 101b. In some embodiments, the conductive bump 102 is disposed adjacent to the second surface 101e of the substrate 101a.

In some embodiments, the conductive bump 102 includes conductive material such as solder, copper, nickel, or gold. In some embodiments, the conductive bump 102 is a solder ball, a ball grid array (BGA) ball, controlled collapse chip connection (C4) bump, microbump, a pillar or the like. In some embodiments, the conductive bump 102 has a spherical, hemispherical or cylindrical shape.

In some embodiments, the first semiconductor structure 100 includes a die 103 disposed over the packaging substrate 101. In some embodiments, the die 103 is disposed over the first surface 101d of the substrate 101a. In some embodiments, the die 103 is fabricated with a predetermined functional circuit within the die 103 produced by photolithography operations. In some embodiments, the die 103 is singulated from a semiconductive wafer by a mechanical blade or a laser blade.

In some embodiments, the die 103 comprises a variety of electrical circuits suitable for a particular application. In some embodiments, the die 103 comprises of any one of various known types of semiconductor devices such as memories, microprocessors, application-specific integrated circuits (ASICs) or the like. In some embodiments, the die 103 is a logic device die or the like.

In some embodiments, the die 103 includes a third surface 103a and a fourth surface 103b opposite to the third surface 103a. In some embodiments, the third surface 103a is a front side or an active side with the circuits or electrical components disposed thereon.

In some embodiments, a bond pad 103c is disposed over the third surface 103a and is configured to receive a conductive structure. In some embodiments, the die 103 is electrically connected to the packaging substrate 101 or the substrate 101a by a bonding wire 104. In some embodiments, the bond pad 103c is electrically connected to a portion of the conductive trace 101b exposed through the protective layer 101c by the bonding wire 104, such that the die 103 is electrically communicable with the packaging substrate 101 or an external semiconductor structure. In some embodiments, the bonding wire 104 includes copper, gold or any other suitable material. In some embodiments, the fourth surface 103b is a back side or an inactive side where the circuits or electrical components are absent.

In some embodiments, the die 103 is bonded over the substrate 101a by an adhesive 105 such as a die attach film (DAF), glue or the like. In some embodiments, the die 103 is attached to the protective layer 101c by the adhesive 105.

In some embodiments, a molding 106 is disposed over the substrate 101a. In some embodiments, the molding 106 is disposed over the first surface 101d of the substrate 101a and covers the die 103. In some embodiments, the molding 106 is disposed over the protective layer 101c and the portion of the conductive trace 101b exposed through the protective layer 101c. In some embodiments, the molding 106 surrounds the die 103, the bond pad 103c, the adhesive 105 and the bonding wire 104.

In some embodiments, the molding 106 can be a single-layer film or a composite stack. In some embodiments, the molding 106 includes various materials, such as molding compound, molding underfill, epoxy, resin, or the like. In some embodiments, the molding 106 has a high thermal conductivity, a low moisture absorption rate and a high flexural strength.

In some embodiments, the metallic layer 107 surrounds the molding 106 and the packaging substrate 101. In some embodiments, the metallic layer 107 surrounds the substrate 101a and the protective layer 101c. In some embodiments, the metallic layer 107 is in contact with the molding 106, the substrate 101a and the protective layer 101c. In some embodiments, the metallic layer 107 is disposed conformal to an outer surface of the molding 106, a sidewall of the protective layer 101c and a sidewall of the substrate 101a.

In some embodiments, the metallic layer 107 is electrically connected to at least a portion 101g of the conductive trace 101b exposed through the packaging substrate 101. In some embodiments, the portion 101g of the conductive trace 101b is exposed through a sidewall of the packaging substrate 101. In some embodiments, the portion 101g of the conductive trace 101b is exposed through the protective layer 101c. In some embodiments, the portion 101g of the conductive trace 101b is in contact with the metallic layer 107. In some embodiments, a sidewall of the portion 101g of the conductive trace 101*b*, the sidewall of the substrate 101*a* and the sidewall of the protective layer 101*c* are vertically aligned.

In some embodiments, the metallic layer 107 is connected to an electrical ground and thus is grounded. In some embodiments, the conductive trace 101*b* is grounded or is connected to an electrical ground. In some embodiments, the metallic layer 107 and the conductive trace 101*b* are connected to an electrical ground. In some embodiments, the metallic layer 107 is grounded by a connection to the grounded conductive trace 101*b*.

In some embodiments, the metallic layer 107 includes gold, silver, copper or the like. In some embodiments, the metallic layer 107 is formed by sputtering, electroplating or any other suitable operation. Since the die 103 and the packaging substrate 101 are surrounded by the metallic layer 107 connected to an electrical ground, the metallic layer 107 can electrically isolate the first semiconductor structure 100 from the surrounding environment and thus an electromagnetic radiation external to the first semiconductor structure 100 would not affect operation of the die 103 and the packaging substrate 101. Further, electromagnetic radiation generated during the operation of the die 103 and the packaging substrate 101 would not affect other semiconductor structures disposed adjacent and external to the first semiconductor structure 100. As such, electromagnetic interference can be reduced or prevented.

Figure 2:
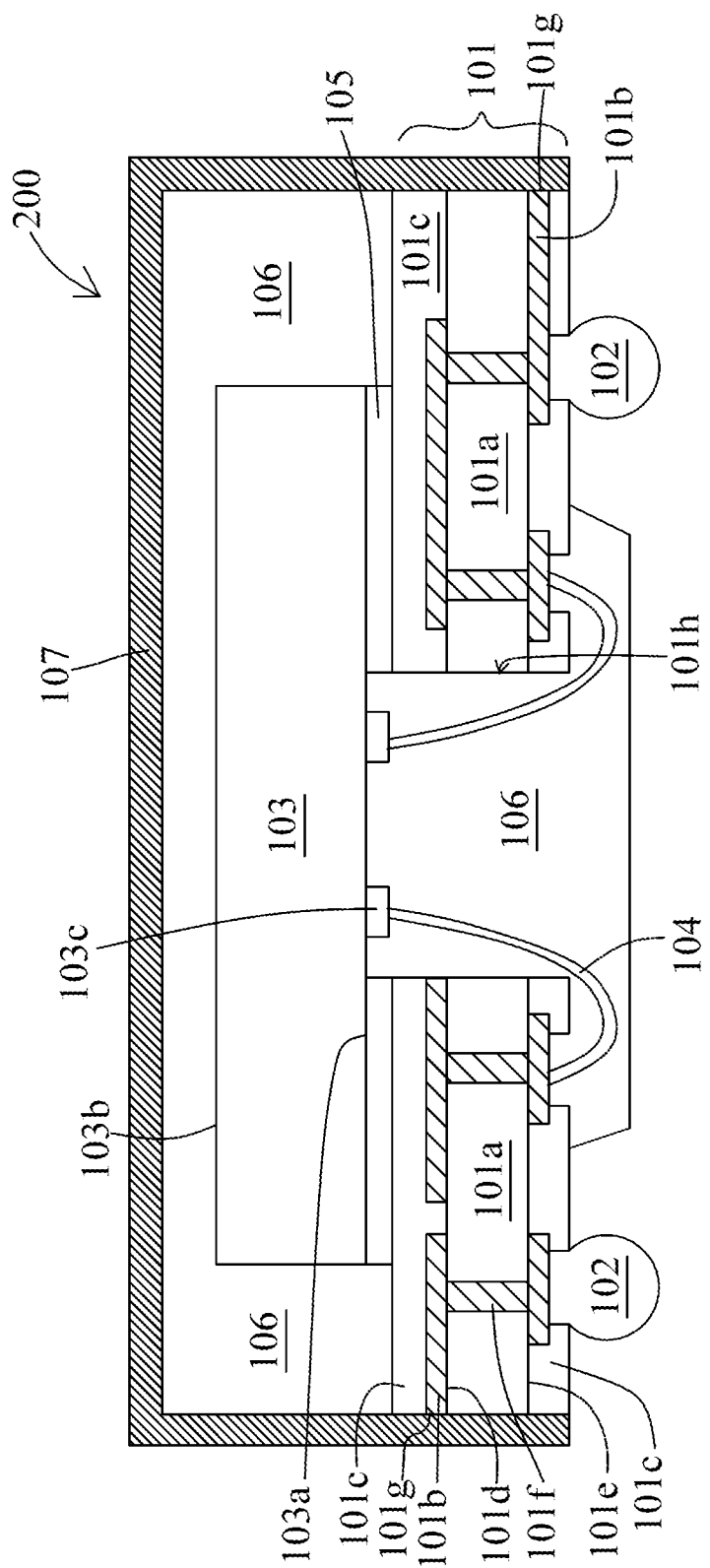
FIG. 2 is a schematic cross-sectional view of a second semiconductor structure in accordance with some embodiments of the present disclosure.

FIG. 2 is a schematic cross-sectional view of a second semiconductor structure 200 in accordance with some embodiments of the present disclosure. In some embodiments, the second semiconductor structure 200 is a semiconductor package or a part of the semiconductor package. In some embodiments, the second semiconductor structure 200 is a window ball grid array (WBGA) package.

In some embodiments, the second semiconductor structure 200 includes a packaging substrate 101, a die 103, a molding 106 and a metallic layer 107, which have configurations similar to those described above or shown in FIG. 1.

In some embodiments, the packaging substrate 101 includes an opening 101*h* extending through the substrate 101 and the protective layer 101*c*. In some embodiments, the molding 106 fills the opening 101*h* and is disposed over the protective layer 101*c* adjacent to the second surface 101*e* of the substrate 101*a*.

In some embodiments, the die 103 is bonded over the protective layer 101*c* adjacent to the first surface 101*d* of the substrate 101*a*. In some embodiments, the third surface 103*a* of the die 103 is attached to the protective layer 101*c* adjacent to the first surface 101*d* of the substrate 101*a* by the adhesive 105.

In some embodiments, the bond pad 103*c* is disposed over the third surface 103*a* of the die 103 and above the opening 101*h*. In some embodiments, the bond pad 103*c* is electrically connected to a portion of the conductive trace 101*b* exposed through the protective layer 101*c* adjacent to the second surface 101*e* of the substrate 101*a*. In some embodiments, the bond pad 103*c* is electrically connected to the conductive trace 101*b* by the bonding wire 104. In some embodiments, the bonding wire 104 is at least partially disposed within the opening 101*h*. In some embodiments, the bond pad 103*c* and the bonding wire 104 are encapsulated by the molding 106.

In some embodiments, the metallic layer 107 is electrically connected to at least a portion 101*g* of the conductive trace 101*b* exposed through the packaging substrate 101. In some embodiments, the portion 101*g* of the conductive trace 101*b* is exposed through a sidewall of the packaging substrate 101. In some embodiments, the portion 101*g* of the conductive trace 101*b* is exposed through the protective layer 101*c*. In some embodiments, the portion 101*g* of the conductive trace 101*b* is in contact with the metallic layer 107. In some embodiments, a sidewall of the portion 101*g* of the conductive trace 101*b*, the sidewall of the substrate 101*a* and the sidewall of the protective layer 101*c* are vertically aligned.

In some embodiments, the metallic layer 107 is grounded or is connected to an electrical ground. In some embodiments, the conductive trace 101*b* is grounded or is connected to an electrical ground. In some embodiments, the metallic layer 107 and the conductive trace 101*b* are connected to an electrical ground. In some embodiments, the metallic layer 107 is grounded by a connection to the grounded conductive trace 101*b*.

Since the die 103 and the packaging substrate 101 are covered by the metallic layer 107 connected to an electrical ground, the metallic layer 107 can electrically isolate the second semiconductor structure 200 from the surrounding environment and thus an electromagnetic radiation external to the second semiconductor structure 200 would not affect operation of the die 103 and the packaging substrate 101.

Further, electromagnetic radiation generated during the operation of the die 103 and the packaging substrate 101 would not affect other semiconductor structures disposed adjacent and external to the second semiconductor structure 200. As such, electromagnetic interference can be reduced or prevented.

Figure 3:
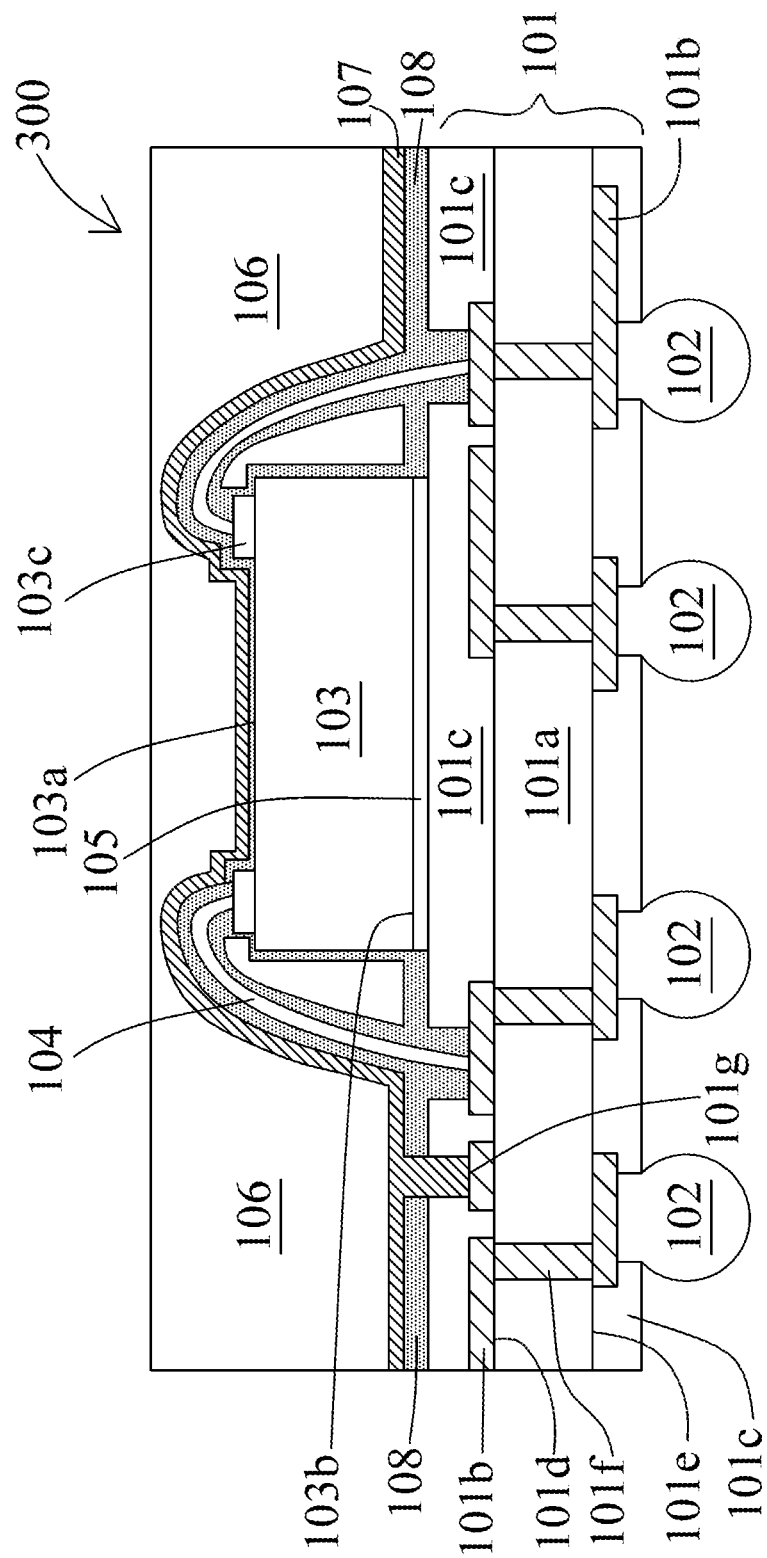
FIG. 3 is a schematic cross-sectional view of a third semiconductor structure in accordance with some embodiments of the present disclosure.

FIG. 3 is a schematic cross-sectional view of a third semiconductor structure 300 in accordance with some embodiments of the present disclosure. In some embodiments, the third semiconductor structure 300 is a semiconductor package or a part of the semiconductor package. In some embodiments, the third semiconductor structure 300 is a plastic ball grid array (PBGA) package, a fine pitch ball grid array (FBGA) package, or the like.

In some embodiments, the third semiconductor structure 300 includes a packaging substrate 101, a die 103, a molding 106 and a metallic layer 107, which have configurations similar to those in the first semiconductor structure 100 described above or shown in FIG. 1.

In some embodiments, the third semiconductor structure 300 includes an insulating layer 108 disposed over the packaging substrate 101. In some embodiments, the insulating layer 108 is disposed over the first surface 101*d* of the substrate 101*a* and surrounds the die 103. In some embodiments, the insulating layer 108 is disposed over the protective layer 101*c* and a portion of the conductive trace 101*b* exposed through the protective layer 101*c*.

In some embodiments, the die 103 is electrically connected to the packaging substrate 101. In some embodiments, the bond pad 103*c* of the die 103 is electrically connected to the conductive trace 101*b* of the substrate 101*a* by a bonding wire 104 coated by the insulating layer 108. In some embodiments, the insulating layer 108 encapsulates the bonding wire 104 and the bond pad 103*c*. In some embodiments, the die 103 is covered by the insulating layer 108, the metallic layer 107 and the molding 106.

In some embodiments, the insulating layer 108 includes dielectric or polymeric material such as oxide, nitride, polymer, polyimide (PI) or the like. In some embodiments, the molding 106 is disposed over or surrounds the insulating layer 108.

In some embodiments, the metallic layer 107 is disposed over the insulating layer 108 and surrounds the die 103. In some embodiments, the metallic layer 107 is disposed conformal to the insulating layer 108. In some embodiments, the metallic layer 107 is electrically connected to at least a portion 101g of the conductive trace 101b exposed through the packaging substrate 101. In some embodiments, the metallic layer 107 is electrically connected to the portion 101g of the conductive trace 101b exposed through the protective layer 101c over the first surface 101d of the substrate 101a. In some embodiments, the portion 101g of the conductive trace 101b is also exposed through the insulating layer 108. In some embodiments, the portion 101g of the conductive trace 101b exposed through the protective layer 101c and the insulating layer 108 is in contact with the metallic layer 107.

In some embodiments, the metallic layer 107 and the conductive trace 101b electrically connected to the metallic layer 107 are electrically connected to an electrical ground. In some embodiments, the metallic layer 107 and the conductive trace 101b electrically connected to the metallic layer 107 are grounded.

Since the die 103 and the packaging substrate 101 are covered by the metallic layer 107 connected to an electrical ground, the metallic layer 107 can electrically isolate the third semiconductor structure 300 from the surrounding environment and thus an electromagnetic radiation external to the third semiconductor structure 300 would not affect operation of the die 103 and the packaging substrate 101.

Further, electromagnetic radiation generated during the operation of the die 103 and the packaging substrate 101 would not affect other semiconductor structures disposed adjacent and external to the third semiconductor structure 300. As such, electromagnetic interference can be reduced or prevented.

Figure 4:
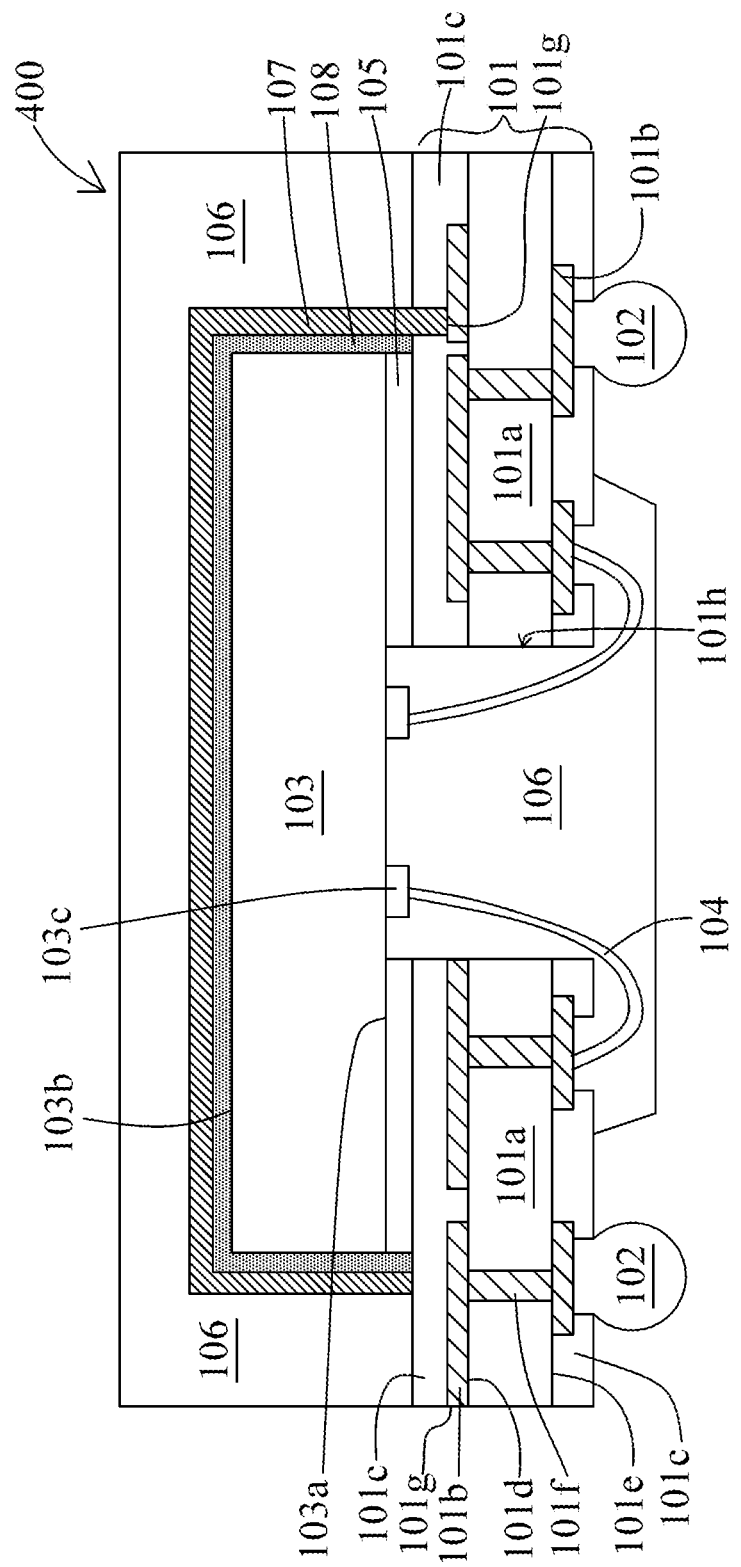
FIG. 4 is a schematic cross-sectional view of a fourth semiconductor structure in accordance with some embodiments of the present disclosure.

FIG. 4 is a schematic cross-sectional view of a fourth semiconductor structure 400 in accordance with some embodiments of the present disclosure. In some embodiments, the fourth semiconductor structure 400 is a semiconductor package or a part of the semiconductor package. In some embodiments, the fourth semiconductor structure 400 is a window ball grid array (WBGA) package.

In some embodiments, the fourth semiconductor structure 400 includes a packaging substrate 101, a die 103, a molding 106 and a metallic layer 107, which have configurations similar to those in the second semiconductor structure 200 described above or shown in FIG. 2.

In some embodiments, the insulating layer 108 covers and surrounds the die 103. In some embodiments, the metallic layer 107 is disposed over the insulating layer 108 and the die 103. In some embodiments, the metallic layer 107 is disposed conformal to the insulating layer 108. In some embodiments, a portion 101g of the conductive trace 101b is exposed through the protective layer 101c and electrically connected to the metallic layer 107.

In some embodiments, the portion 101g of the conductive trace 101b is in contact with the metallic layer 107. In some embodiments, the metallic layer 107 and the conductive trace 101b electrically connected to the metallic layer 107 are electrically connected to an electrical ground. In some embodiments, the metallic layer 107 and the conductive trace 101b are grounded.

Since the die 103 is covered by the metallic layer 107 connected to an electrical ground, the metallic layer 107 can electrically isolate the die 103 from the surrounding environment and thus an electromagnetic radiation external to the die 103 would not affect operation of the die 103.

Further, electromagnetic radiation generated during the operation of the die 103 would not affect other semiconductor structures disposed adjacent and external to the die 103. As such, electromagnetic interference can be reduced or prevented.

Figure 5:
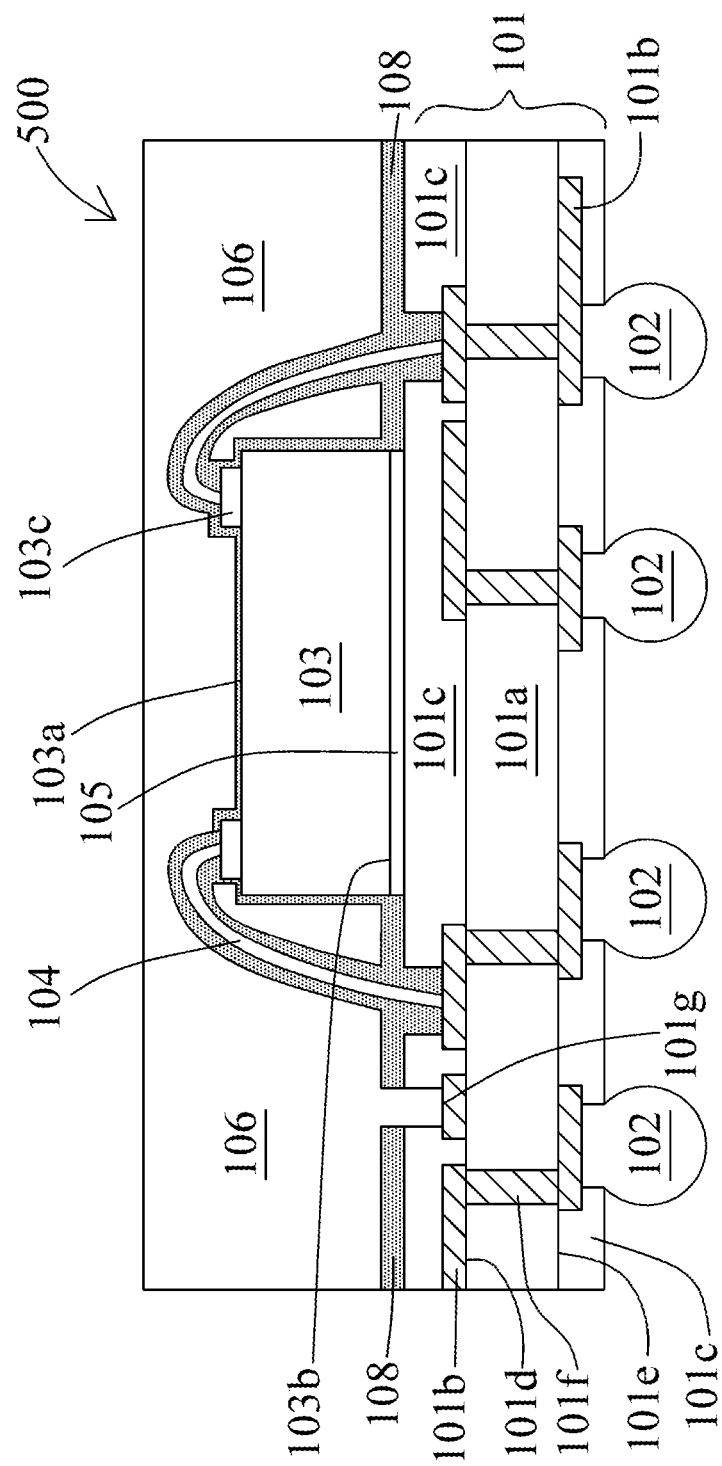
FIG. 5 is a schematic cross-sectional view of a fifth semiconductor structure in accordance with some embodiments of the present disclosure.

FIG. 5 is a schematic cross-sectional view of a fifth semiconductor structure 500 in accordance with some embodiments of the present disclosure. In some embodiments, the fifth semiconductor structure 500 is a semiconductor package or a part of the semiconductor package. In some embodiments, the fifth semiconductor structure 500 is a plastic ball grid array (PBGA) package, a fine pitch ball grid array (FBGA) package, or the like.

In some embodiments, the fifth semiconductor structure 500 includes a packaging substrate 101, a die 103, a molding 106 and a metallic layer 107, which have configurations similar to those in the third semiconductor structure 300 described above or shown in FIG. 3.

In some embodiments, the molding 106 is disposed over the insulating layer 108. In some embodiments, the molding 106 is conductive or includes conductive material. In some embodiments, the molding 106 includes molding compound and metallic particles such as carbon, copper, gold or the like. In some embodiments, the metallic particles are implanted into the molding 106 by doping, implantation or any other suitable operation.

In some embodiments, at least a portion 101g of the conductive trace 101b is exposed through the packaging substrate 101. In some embodiments, the portion 101g of the conductive trace 101b is exposed through the protective layer 101c and the insulating layer 108. In some embodiments, the molding 106 is electrically connected to the portion 101g of the conductive trace 101b. In some embodiments, the molding 106 is in contact with the portion 101g of the conductive trace 101b. In some embodiments, the molding 106 and the conductive trace 101b are electrically connected to an electrical ground and thus are grounded.

Since the die 103 and the packaging substrate 101 are covered by the conductive molding 106 connected to an electrical ground, the molding 106 can electrically isolate the die 103 and the packaging substrate 101 from the surrounding environment and thus an electromagnetic radiation external to the fifth semiconductor structure 500 would not affect operation of the die 103 and the packaging substrate 101.

Further, electromagnetic radiation generated during the operation of the die 103 and the packaging substrate 101 would not affect other semiconductor structures disposed adjacent and external to the fifth semiconductor structure 500. As such, electromagnetic interference can be reduced or prevented.

Figure 6:
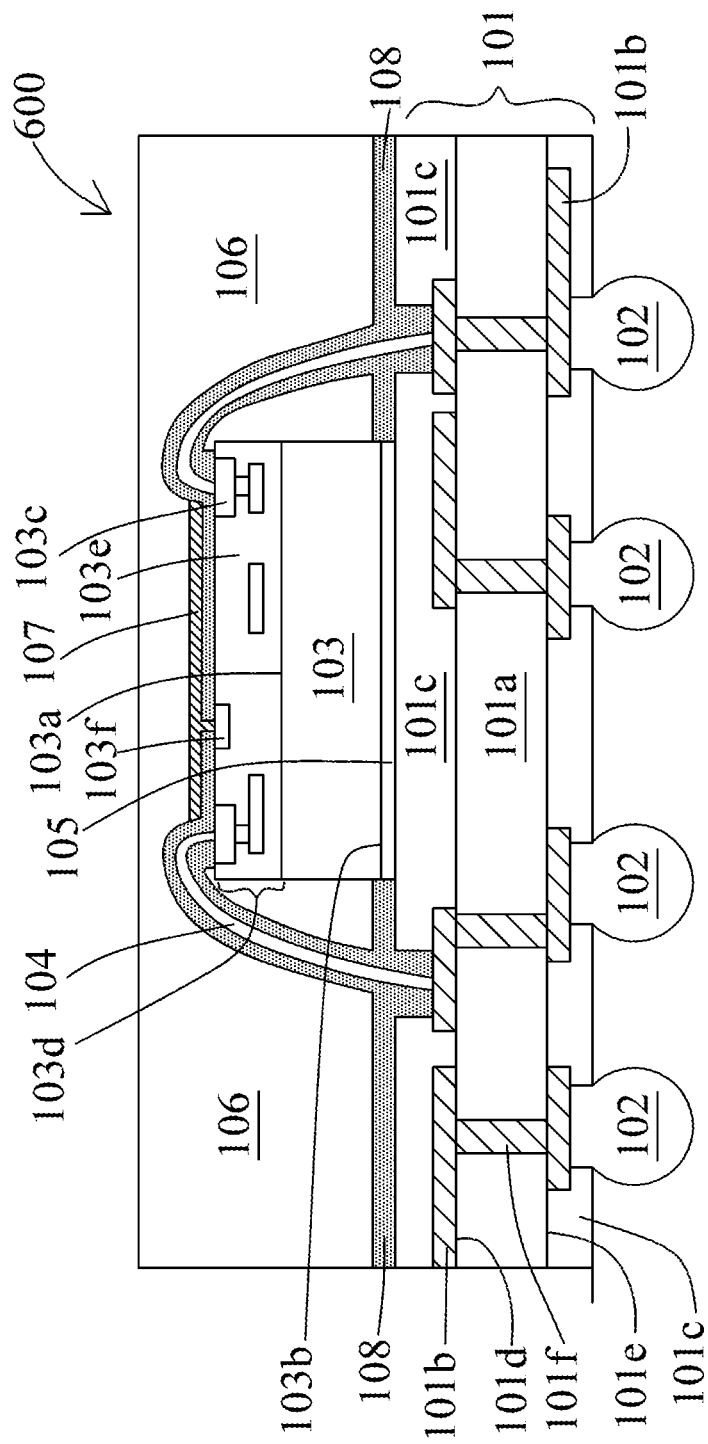
FIG. 6 is a schematic cross-sectional view of a sixth semiconductor structure in accordance with some embodiments of the present disclosure.

FIG. 6 is a schematic cross-sectional view of a sixth semiconductor structure 600 in accordance with some embodiments of the present disclosure. In some embodiments, the sixth semiconductor structure 600 is a semiconductor package or a part of the semiconductor package. In some embodiments, the sixth semiconductor structure 600 is a plastic ball grid array (PBGA) package, a fine pitch ball grid array (FBGA) package, or the like.

In some embodiments, the sixth semiconductor structure 600 includes a packaging substrate 101, a die 103, a molding 106 and a metallic layer 107 which have configurations similar to those in the third semiconductor structure 300 or the fifth semiconductor structure 500 described above or shown in FIG. 3 or 5.

In some embodiments, a redistribution layer (RDL) 103d is formed over the die 103. In some embodiments, the RDL 103d is formed over the third surface 103a of the die 103. In some embodiments, the RDL 103d includes a dielectric layer 103e and an interconnect structure 103f extending along or through the dielectric layer 103e.

In some embodiments, the RDL 103d is configured to redistribute terminals of the die 103 and re-route a path of a circuitry of the die 103. In some embodiments, the RDL 103d is covered by the insulating layer 108. In some embodiments, the dielectric layer 103e includes polymeric material such as polymer, polyimide (PI) or the like. In some embodiments, the interconnect structure 103f includes conductive material such as copper, gold, aluminum or the like.

In some embodiments, the metallic layer 107 is disposed over the insulating layer 108 and the die 103. In some embodiments, a portion of the interconnect structure 103f of the RDL 103d is exposed through the insulating layer 108 and is electrically connected to an electrical ground. In some embodiments, the interconnect structure 103f is grounded. In some embodiments, the metallic layer 107 is electrically connected to the grounded interconnect structure 103f. In some embodiments, the metallic layer 107 is in contact with the portion of the interconnect structure 103f of the RDL 103d exposed through the insulating layer 108.

Since the die 103 is covered by the metallic layer 107 connected to an electrical ground, the metallic layer 107 can electrically isolate the die 103 from the surrounding environment and thus an electromagnetic radiation external to the die 103 would not affect operation of the die 103. Further, electromagnetic radiation generated during the operation of the die 103 would not affect other semiconductor structures disposed adjacent and external to the die 103. As such, electromagnetic interference can be reduced or prevented.

Figure 7:
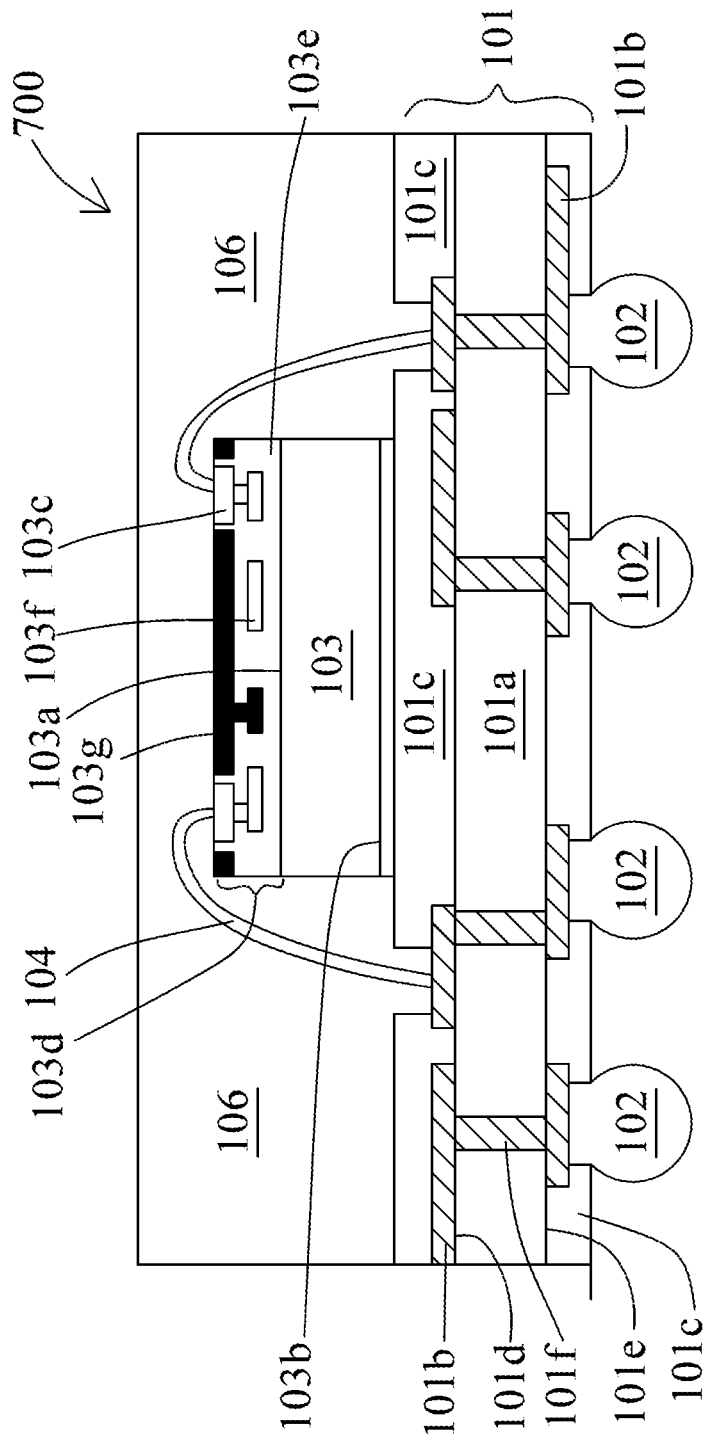
FIG. 7 is a schematic cross-sectional view of a seventh semiconductor structure in accordance with some embodiments of the present disclosure.

FIG. 7 is a schematic cross-sectional view of a seventh semiconductor structure 700 in accordance with some embodiments of the present disclosure. In some embodiments, the seventh semiconductor structure 700 is a semiconductor package or a part of the semiconductor package. In some embodiments, the seventh semiconductor structure 700 is a plastic ball grid array (PBGA) package, a fine pitch ball grid array (FBGA) package, or the like.

In some embodiments, the seventh semiconductor structure 700 includes a packaging substrate 101, a die 103 and a molding 106, which have configurations similar to those in the third semiconductor structure 300 described above or shown in FIG. 3.

In some embodiments, a redistribution layer (RDL) 103d is formed over the die 103. In some embodiments, the RDL 103d is formed over the third surface 103a of the die 103. In some embodiments, the RDL 103d includes a dielectric layer 103e and an interconnect structure 103f extending along or through the dielectric layer 103e.

In some embodiments, the RDL 103d is configured to redistribute terminals of the die 103 and re-route a path of a circuitry of the die 103. In some embodiments, the dielectric layer 103e includes polymeric material such as polymer, polyimide (PI) or the like. In some embodiments, the interconnect structure 103f includes conductive material such as copper, gold, aluminum or the like.

In some embodiments, the interconnect structure 103f of the RDL 103d includes a conductive plane 103g surrounded by and at least partially exposed from the dielectric layer 103e. In some embodiments, the conductive plane 103g is a grounded plane or is connected to an electrical ground.

Since the die 103 is covered by the conductive plane 103g connected to an electrical ground, the conductive plane 103g can electrically isolate the die 103 from the surrounding environment and thus an electromagnetic radiation external to the die 103 would not affect operation of the die 103. Further, electromagnetic radiation generated during the operation of the die 103 would not affect other semiconductor structures disposed adjacent and external to the die 103. As such, electromagnetic interference can be reduced or prevented.

Figure 8:
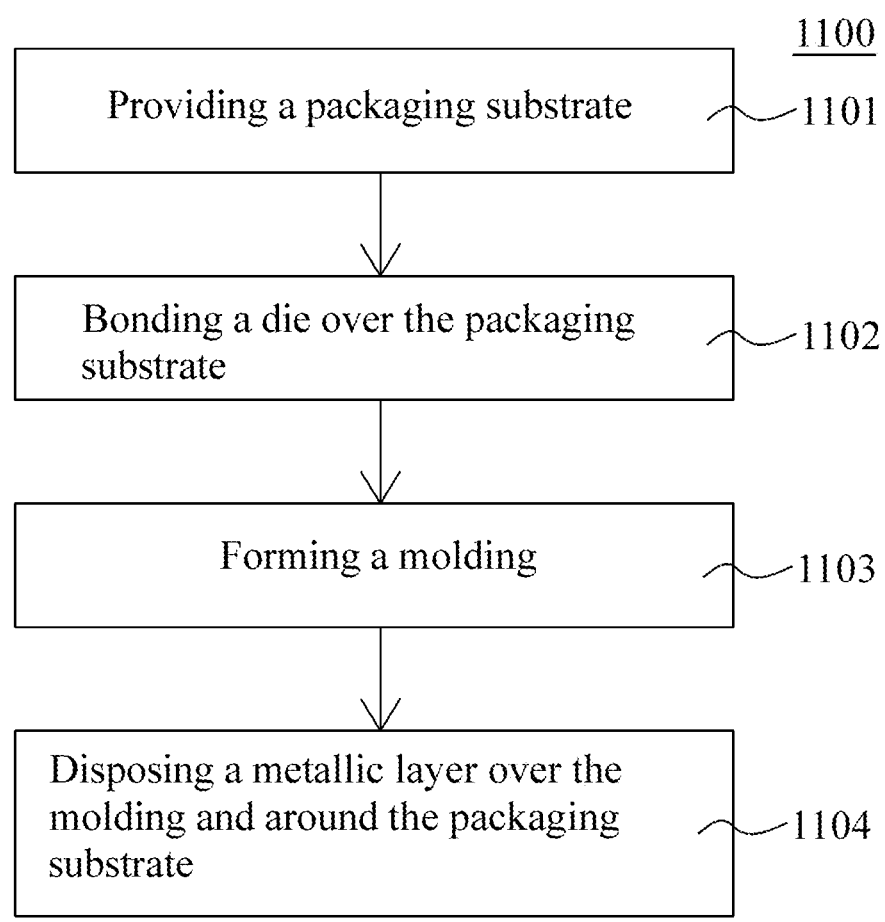
FIG. 8 is a flowchart of a method of manufacturing a first or second semiconductor structure in accordance with some embodiments of the present disclosure.

In the present disclosure, a method of manufacturing a semiconductor structure is also disclosed. In some embodiments, a first semiconductor structure 100 and a second semiconductor structure 200 can be formed by a method 1100 as shown in FIG. 8. The method 1100 includes a number of operations, and the description and illustration are not deemed as a limitation to the sequence of the operations. The method 1100 includes a number of steps (1101, 1102, 1103 and 1104).

Figure 9:
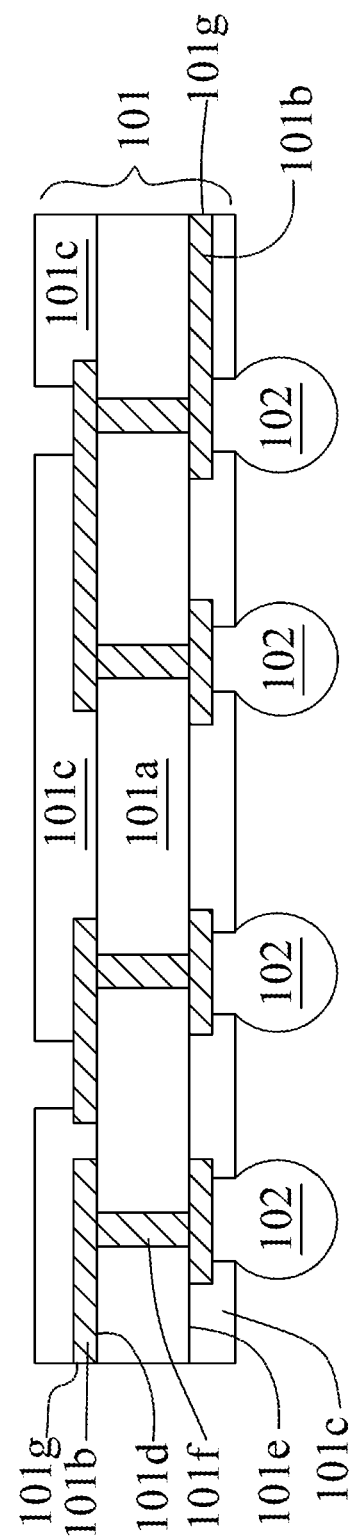
FIGS. 9 to 12 are schematic views of manufacturing the first or second semiconductor structure by the method of FIG. 8 in accordance with some embodiments of the present disclosure.

In step 1101, a packaging substrate 101 is provided as shown in FIG. 9. In some embodiments, the packaging substrate 101 includes a substrate 101a, a conductive trace 101b and a protective layer 101c, which have configurations similar to those described above or shown in FIG. 1.

Figure 10:
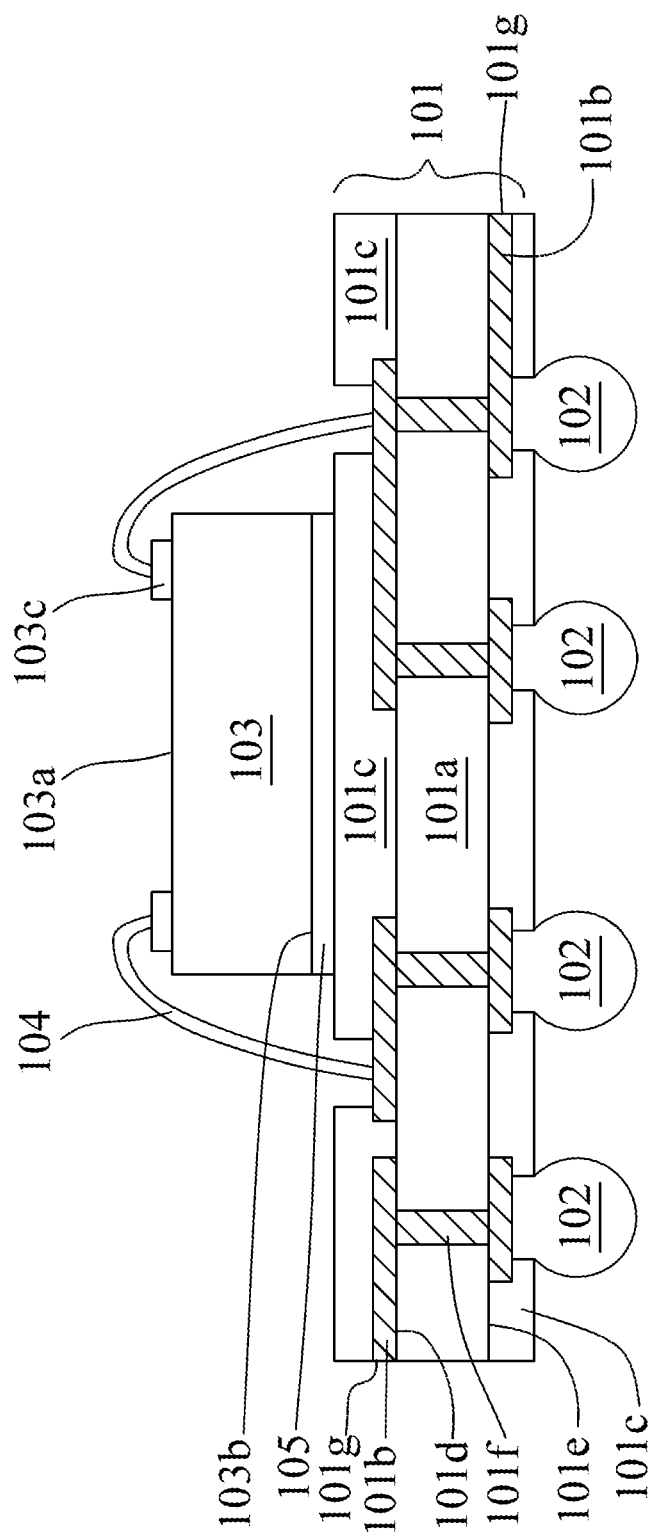

In step 1102, a die 103 is bonded over the packaging substrate 101 as shown in FIG. 10. In some embodiments, the die 103 has configurations similar to those described above or shown in FIG. 1. In some embodiments, the die 103 is attached to the protective layer 101c of the packaging substrate 101 by an adhesive 105, and the die 103 is electrically connected to the packaging substrate 101 by wire bonding operations. In some embodiments, a bond pad 103c of the die 103 is electrically connected to a conductive trace 101b of the packaging substrate 101 through a bonding wire 104.

Figure 11:
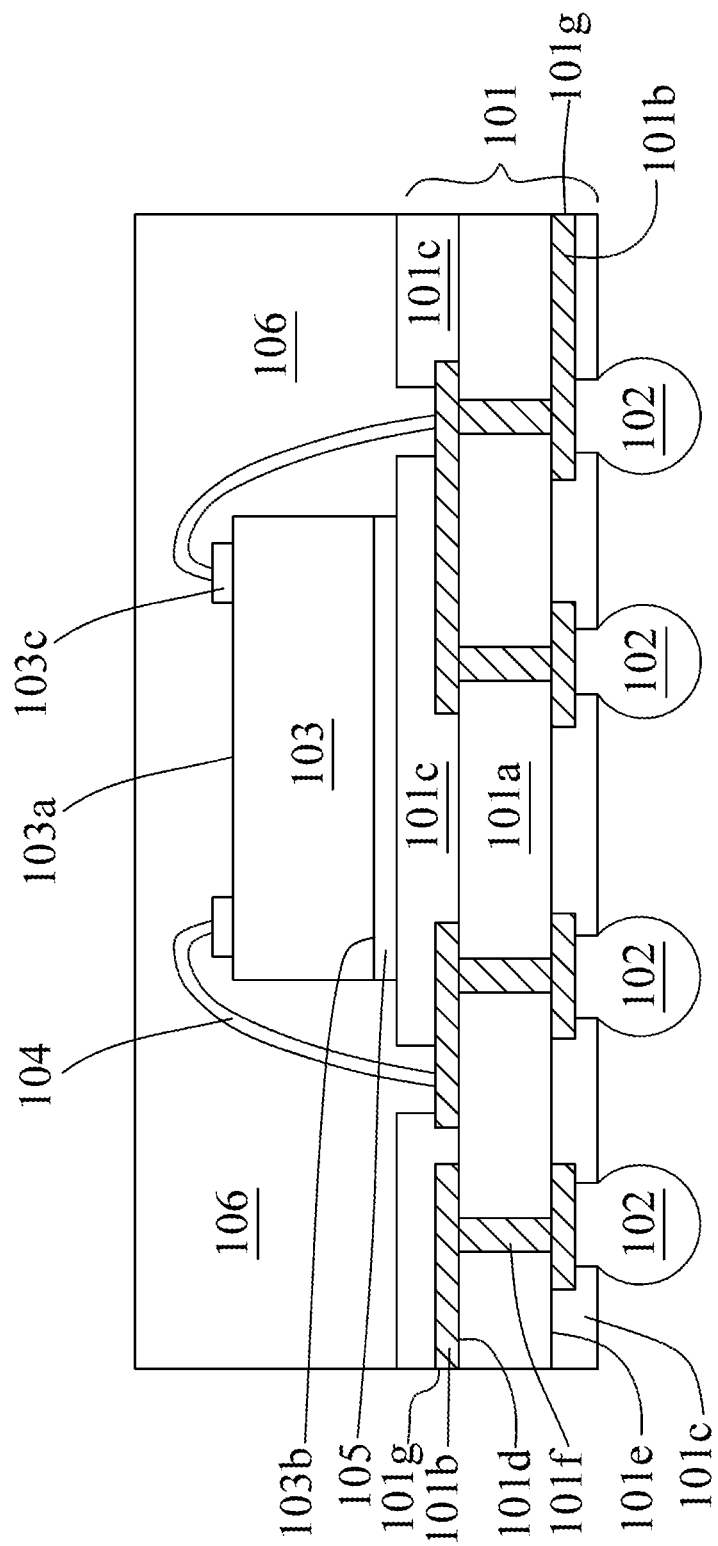

In step 1103, a molding 106 is formed as shown in FIG. 11. In some embodiments, the molding 106 surrounds the die 103 and is disposed over the packaging substrate 101. In some embodiments, the molding 106 is formed by compression molding, transfer molding or any other suitable operation. In some embodiments, the molding 106 has configurations similar to those described above or shown in FIG. 1.

Figure 12:
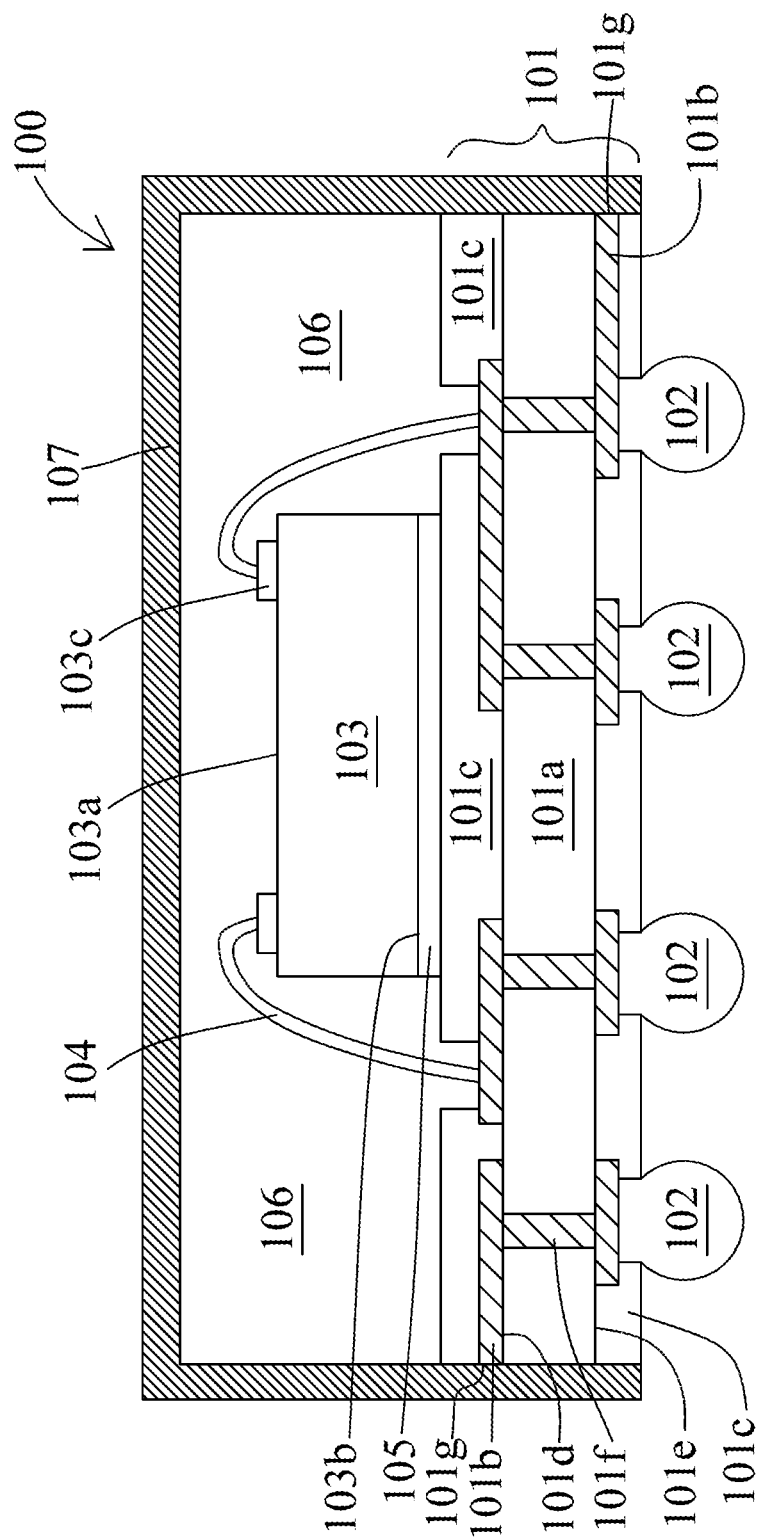

In step 1104, a metallic layer 107 is disposed over the molding 106 and around the packaging substrate 101 as shown in FIG. 12. In some embodiments, the metallic layer 107 is disposed by sputtering, electroplating or any other suitable operation. In some embodiments, the metallic layer 107 is in contact with a portion 101g of the conductive trace 101b exposed through a sidewall of the protective layer 101c, such that the metallic layer 107 is electrically connected to the conductive trace 101b. In some embodiments, the conductive trace 101b and the metallic layer 107 are electrically connected to an electrical ground and thus are grounded. In some embodiments, the metallic layer 107 has configurations similar to those described above or shown in FIG. 1. In some embodiments, the first semiconductor structure 100 as shown in FIG. 1 is formed.

Figure 13:
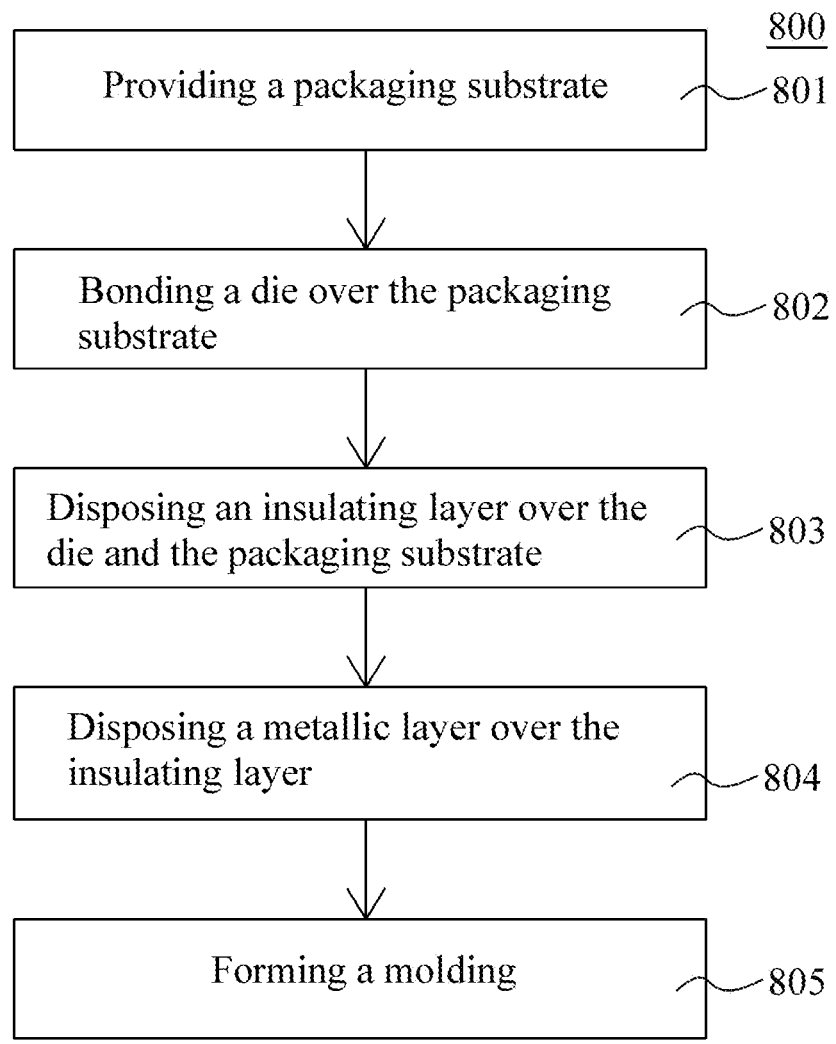
FIG. 13 is a flowchart of a method of manufacturing a third or fourth semiconductor structure in accordance with some embodiments of the present disclosure.

In the present disclosure, a method of manufacturing a semiconductor structure is also disclosed. In some embodiments, a third semiconductor structure 300 and a fourth semiconductor structure 400 can be formed by a method 800 as shown in FIG. 13. The method 800 includes a number of operations and the description and illustration are not deemed as a limitation to the sequence of the operations. The method 800 includes a number of steps (801, 802, 803, 804 and 805).

Figure 14:
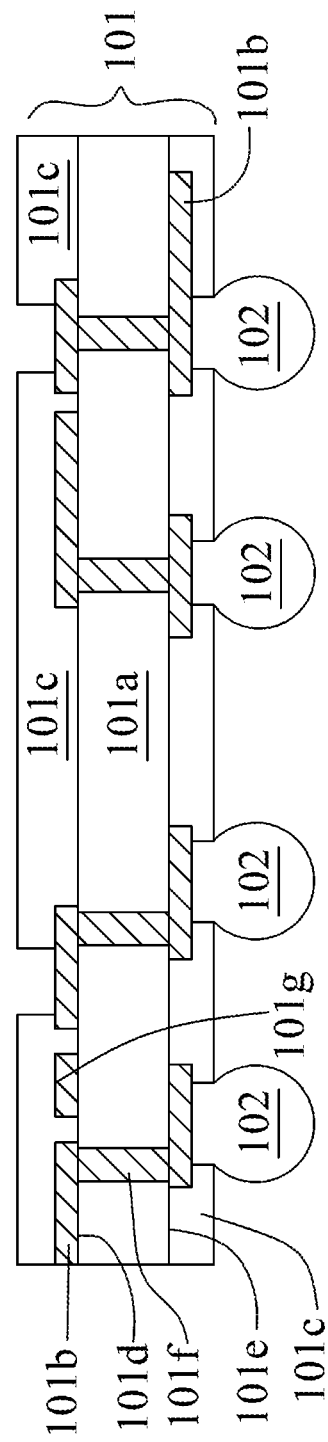
FIGS. 14 to 18 are schematic views of manufacturing the third or fourth semiconductor structure by the method of FIG. 13 in accordance with some embodiments of the present disclosure.

In step 801, a packaging substrate 101 is provided as shown in FIG. 14. In some embodiments, the packaging substrate 101 includes a substrate 101a, a conductive trace 101b and a protective layer 101c, which have configurations similar to those described above or shown in FIG. 3.

Figure 15:
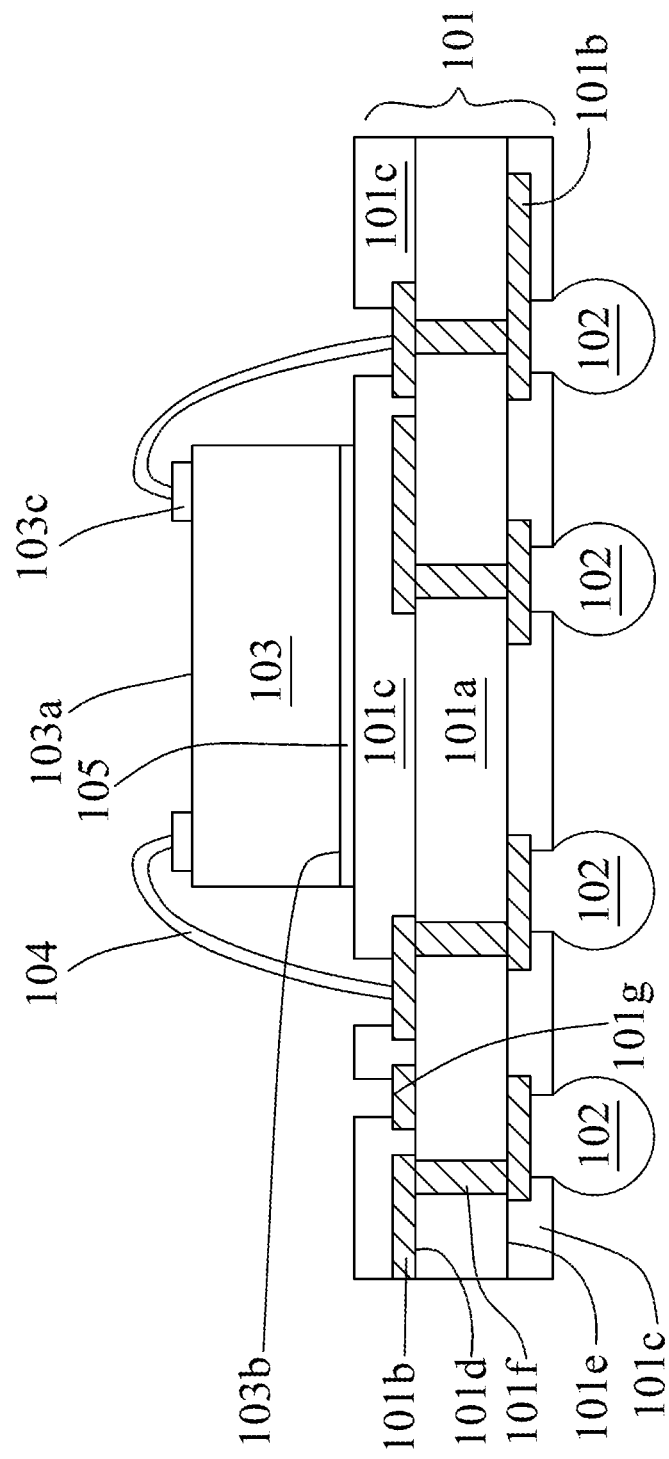

In step 802, a die 103 is bonded over the packaging substrate 101 as shown in FIG. 15. In some embodiments, the die 103 has configurations similar to those described above or shown in FIG. 3. In some embodiments, the die 103 is attached to the protective layer 101c of the packaging substrate 101 by an adhesive 105, and is electrically connected to the packaging substrate 101 by wire bonding operations. In some embodiments, a bond pad 103c of the die 103 is electrically connected to a conductive trace 101b of the packaging substrate 101 through a bonding wire 104.

Figure 16:
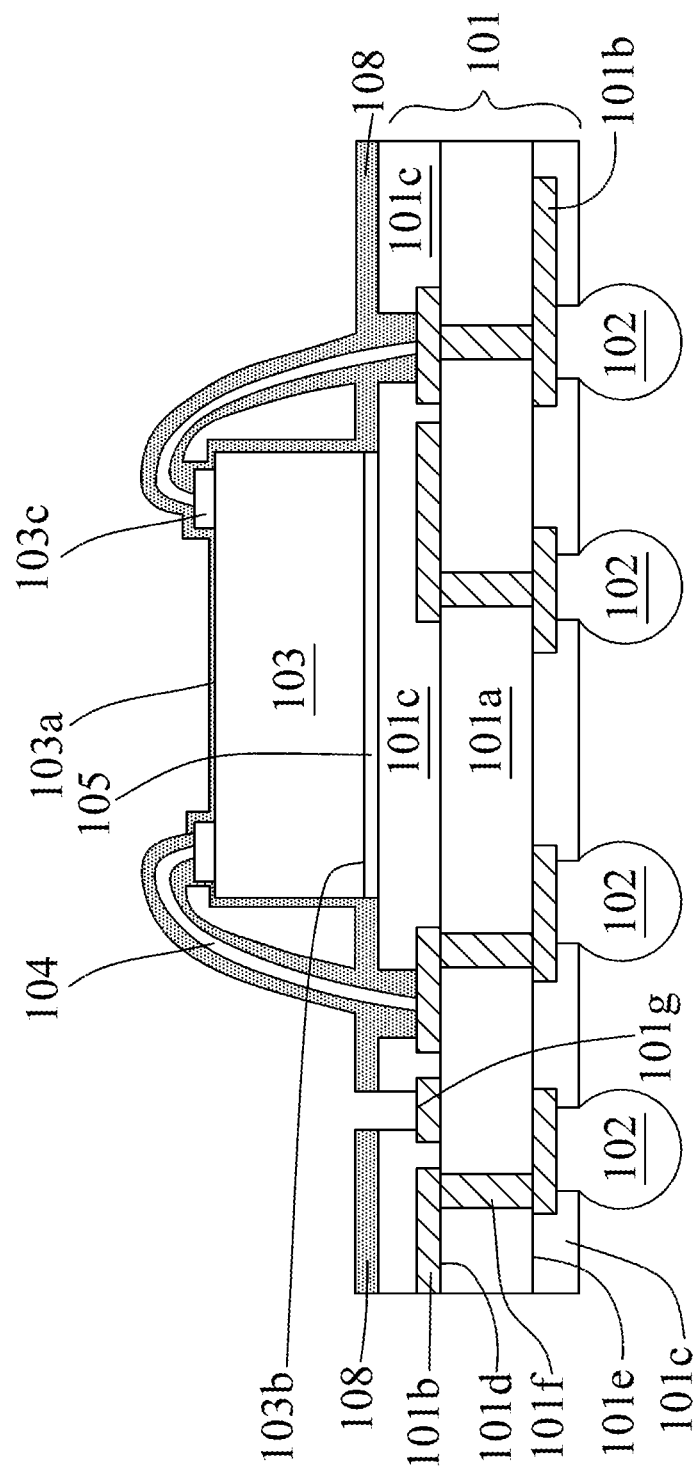

In step 803, an insulating layer 108 is disposed over the die 103 and the packaging substrate 101 as shown in FIG. 16. In some embodiments, the insulating layer 108 is disposed over the protective layer 101c, surrounds the die 103, covers the bond pad 103c and encapsulates the bonding wire 104.

In some embodiments, a portion of the insulating layer 108 is next removed by etching, drilling or any other suitable operation, so as to expose the portion 101g of the conductive trace 101b. In some embodiments, the insulating layer 108 has configurations similar to those described above or shown in FIG. 3.

Figure 17:
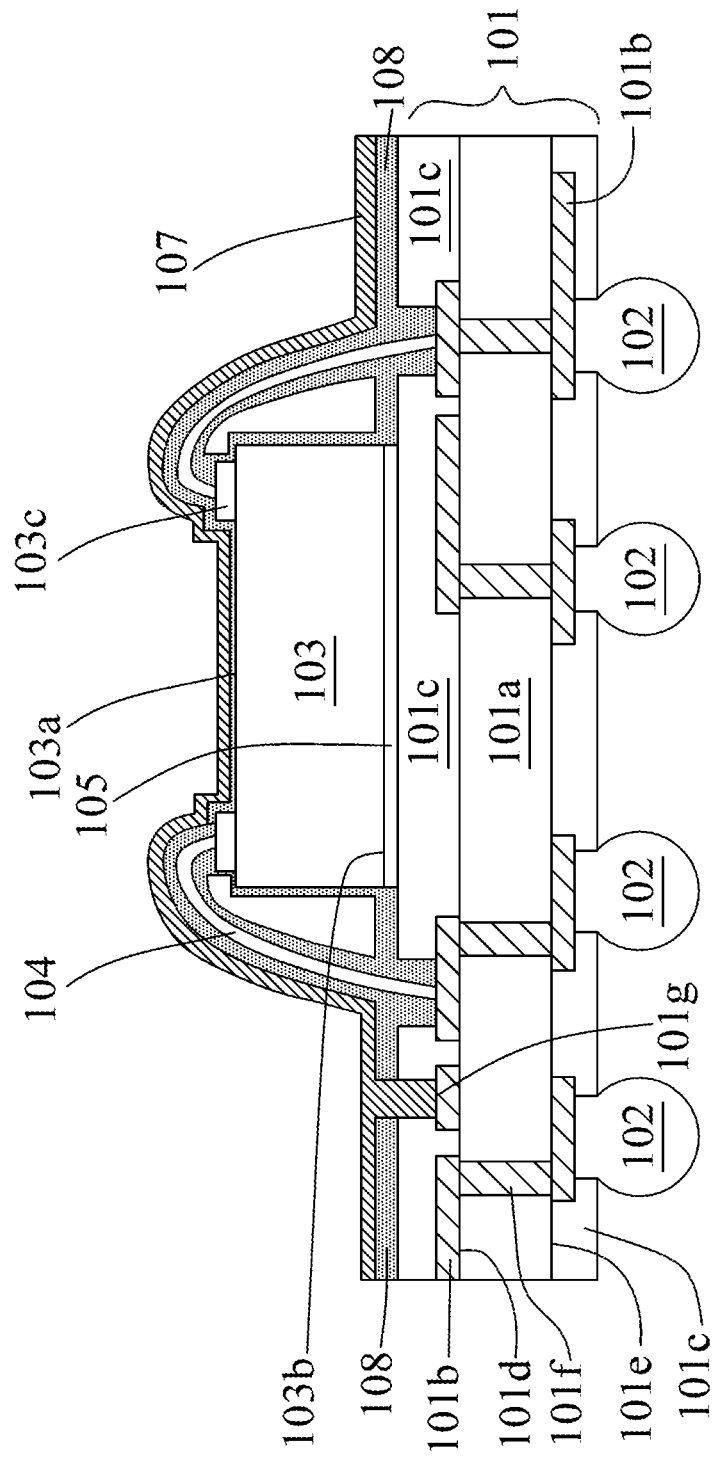

In step 804, a metallic layer 107 is disposed over the insulating layer 108 as shown in FIG. 17. In some embodiments, the metallic layer 107 is disposed over and surrounds the die 103. In some embodiments, the metallic layer 107 is disposed by sputtering, electroplating or any other suitable operation. In some embodiments, the metallic layer 107 is in contact with the portion 101g of the conductive trace 101b exposed through the protective layer 101c and the insulating layer 108, such that the metallic layer 107 is electrically connected to the conductive trace 101b.

In some embodiments, the conductive trace 101b and the metallic layer 107 are electrically connected to an electrical ground and thus are grounded. In some embodiments, the metallic layer 107 has configurations similar to those described above or shown in FIG. 3.

Figure 18:
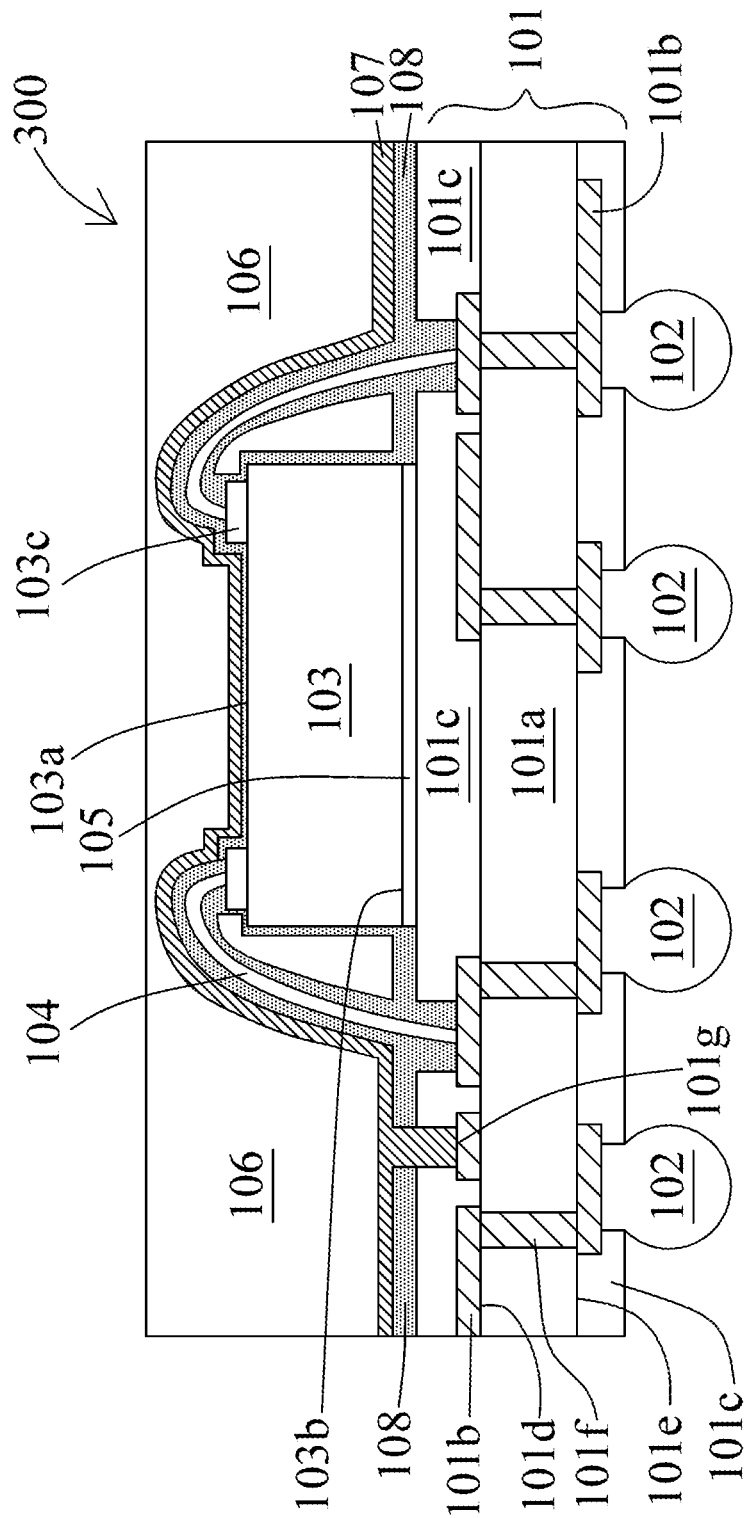

In step 805, a molding 106 is formed as shown in FIG. 18. In some embodiments, the molding 106 is disposed over the insulating layer 108 and the metallic layer 107, and surrounds the die 103. In some embodiments, the molding 106 is formed by compression molding, transfer molding or any other suitable operation. In some embodiments, the molding 106 has configurations similar to those described above or shown in FIG. 3. In some embodiments, the third semiconductor structure 300 as shown in FIG. 3 is formed.

Figure 19:
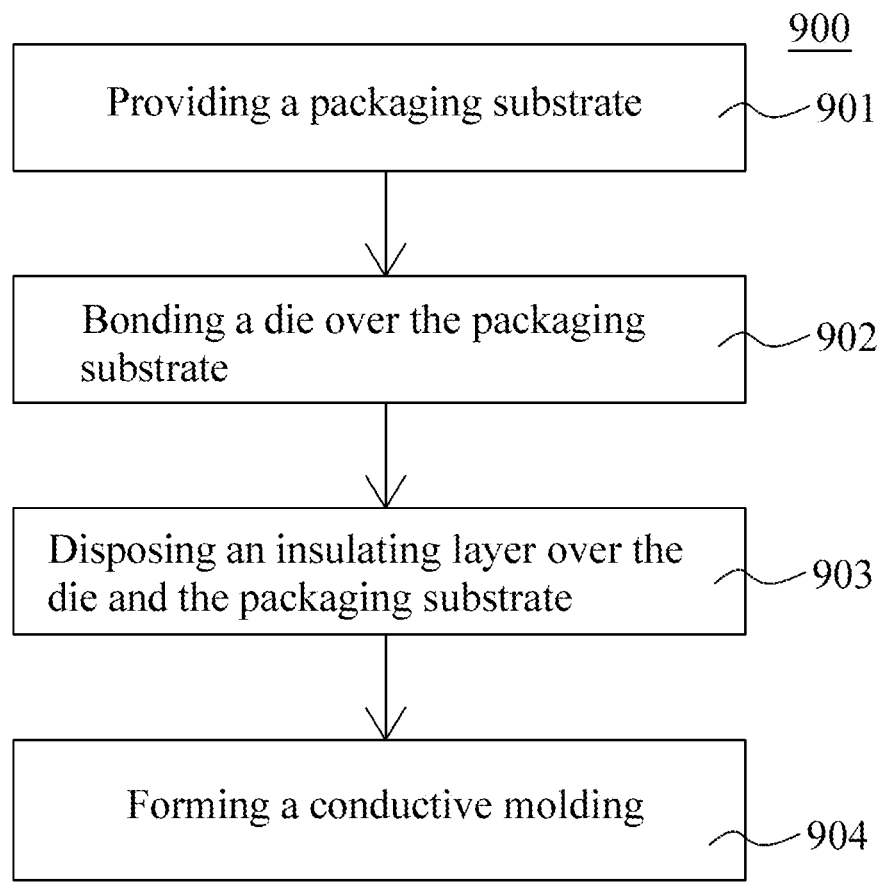
FIG. 19 is a flowchart of a method of manufacturing a fifth semiconductor structure in accordance with some embodiments of the present disclosure.

In the present disclosure, a method of manufacturing a semiconductor structure is also disclosed. In some embodiments, a fifth semiconductor structure 500 can be formed by a method 900 as shown in FIG. 19. The method 900 includes a number of operations and the description and illustration are not deemed as a limitation to the sequence of the operations. The method 900 includes a number of steps (901, 902, 903 and 904).

Figure 20:
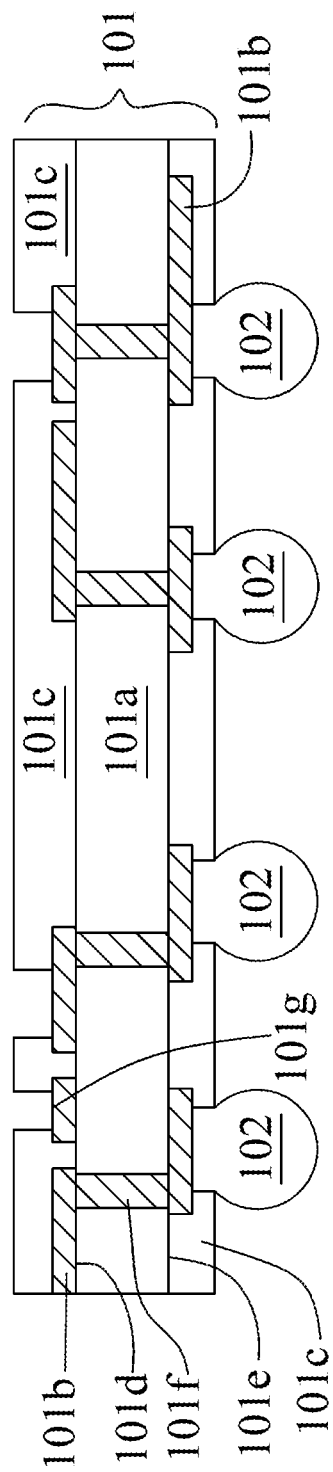
FIGS. 20 to 23 are schematic views of manufacturing the fifth semiconductor structure by the method of FIG. 19 in accordance with some embodiments of the present disclosure.

In step 901, a packaging substrate 101 is provided as shown in FIG. 20. In some embodiments, the packaging substrate 101 includes a substrate 101a, a conductive trace 101b and a protective layer 101c, which have configurations similar to those described above or shown in FIG. 5.

Figure 21:
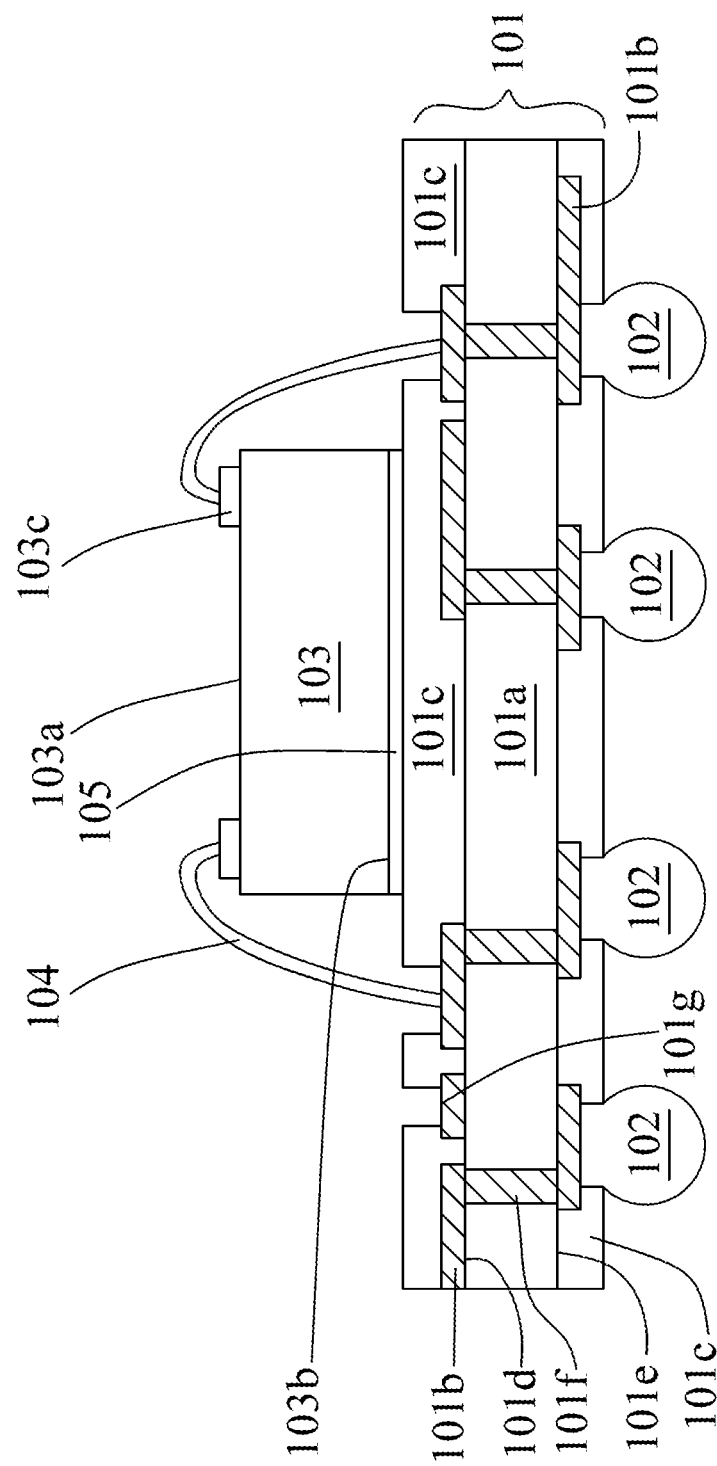

In step 902, a die 103 is bonded over the packaging substrate 101 as shown in FIG. 21. In some embodiments, the die 103 has configurations similar to those described above or shown in FIG. 5. In some embodiments, the die 103 is attached to the protective layer 101c of the packaging substrate 101 by an adhesive 105, and the die 103 is electrically connected to the packaging substrate 101 by wire bonding operations. In some embodiments, a bond pad 103c of the die 103 is electrically connected to a conductive trace 101b of the packaging substrate 101 through a bonding wire 104.

Figure 22:
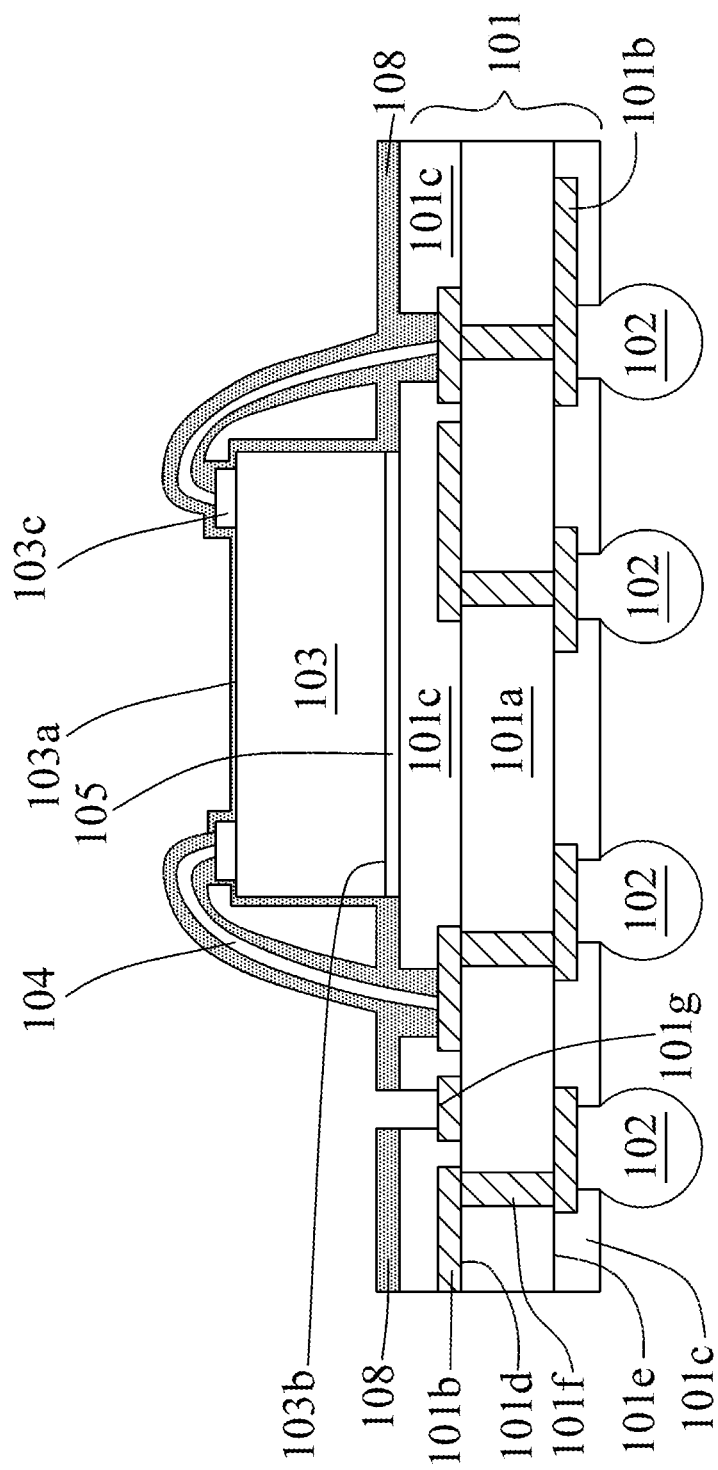

In step 903 an insulating layer 108 is disposed over the die 103 and the packaging substrate 101 as shown in FIG. 22. In some embodiments, the insulating layer 108 is disposed over the protective layer 101c, surrounds the die 103, covers the bond pad 103c and encapsulates the bonding wire 104. In some embodiments, a portion of the insulating layer 108 is next removed by etching, drilling or any other suitable operation, so as to expose the portion 101g of the conductive trace 101b. In some embodiments, the insulating layer 108 has configurations similar to those described above or shown in FIG. 5.

Figure 23:
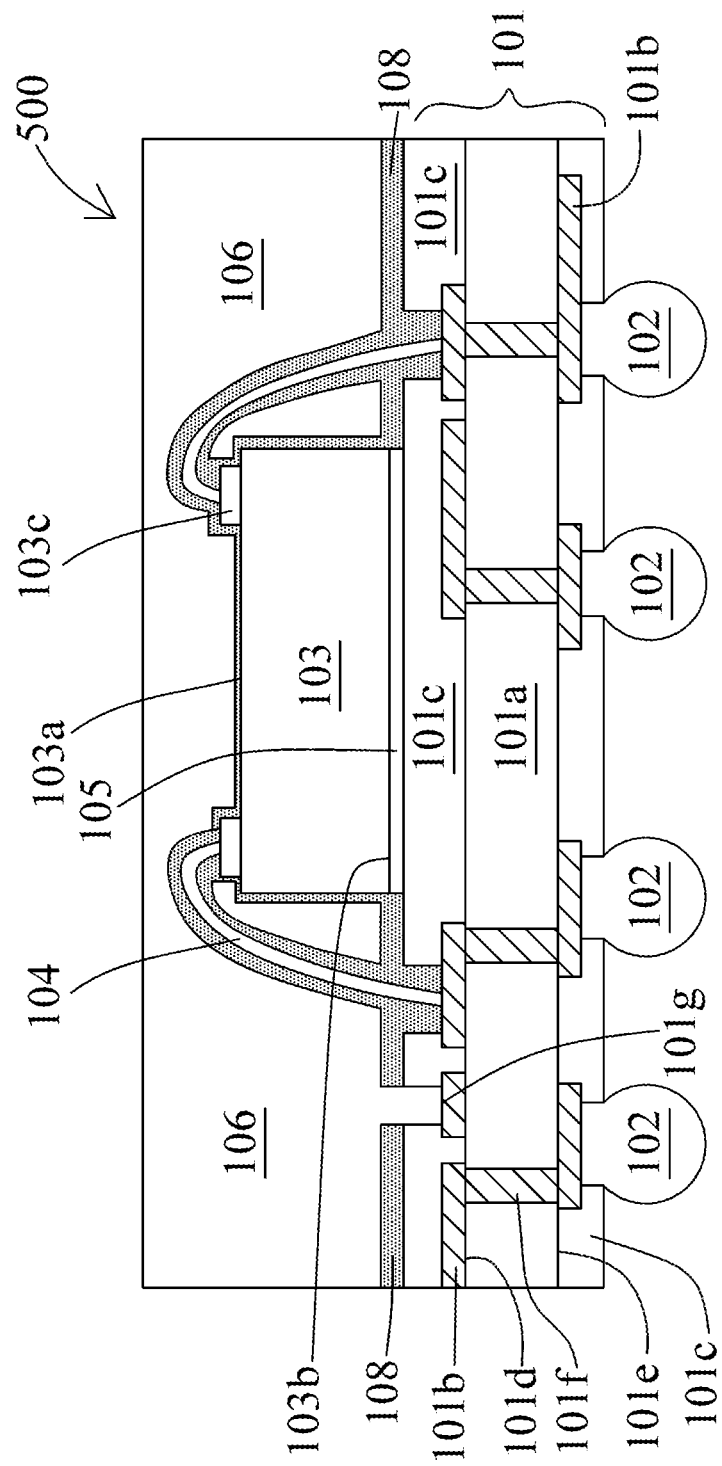

In step 904, a molding 106 is formed as shown in FIG. 23. In some embodiments, the molding 106 is conductive or includes conductive material. In some embodiments, the molding 106 includes metallic particles. In some embodiments, the molding 106 is disposed over the insulating layer 108 and surrounds the die 103. In some embodiments, the conductive molding 106 is in contact with the portion 101g of the conductive trace 101b. In some embodiments, the conductive molding 106 and the conductive trace 101b are electrically connected to an electrical ground and thus are grounded.

In some embodiments, the molding 106 is formed by compression molding, transfer molding or any other suitable operation. In some embodiments, the molding 106 has configurations similar to those described above or shown in FIG. 5. In some embodiments, the fifth semiconductor structure 500 as shown in FIG. 5 is formed.

Figure 24:
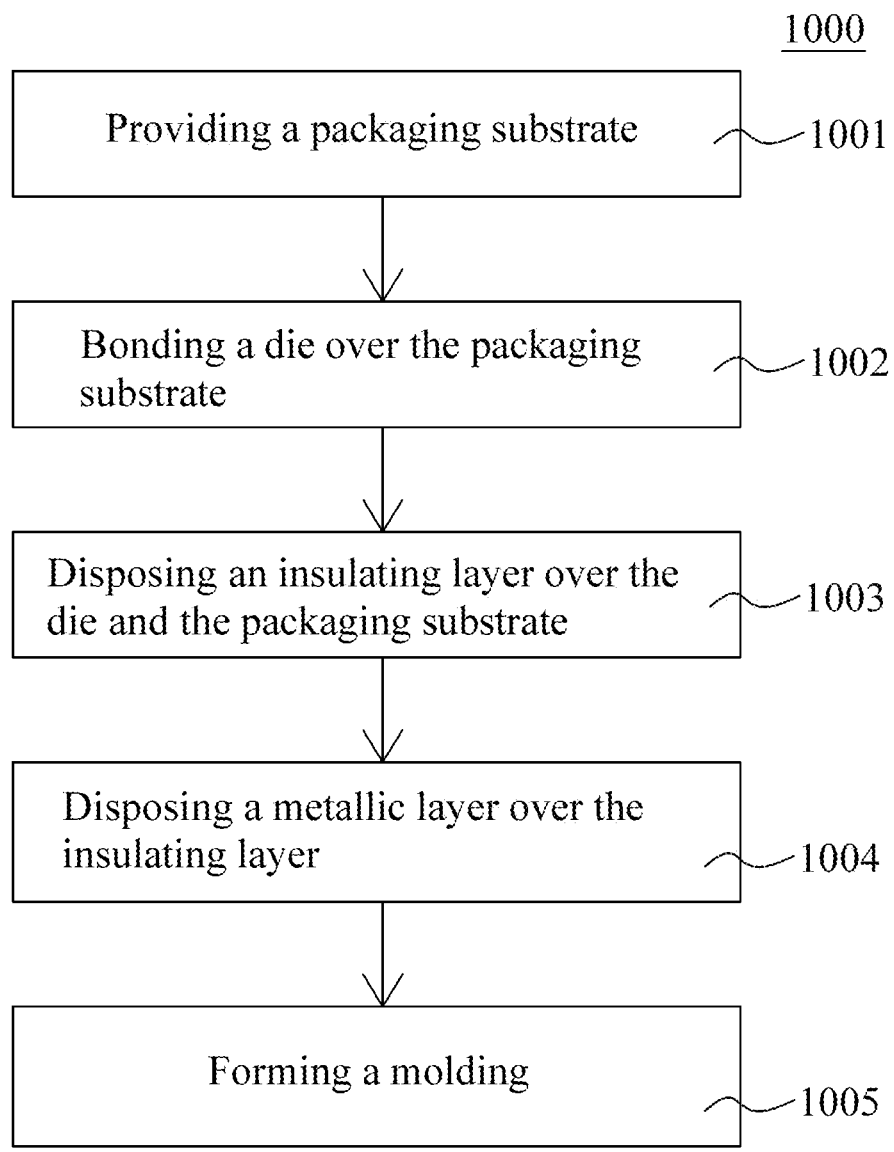
FIG. 24 is a flowchart of a method of manufacturing a sixth semiconductor structure in accordance with some embodiments of the present disclosure.

In the present disclosure, a method of manufacturing a semiconductor structure is also disclosed. In some embodiments, a sixth semiconductor structure 600 can be formed by a method 1000 as shown in FIG. 24. The method 1000 includes a number of operations and the description and illustration are not deemed as a limitation to the sequence of the operations. The method 1000 includes a number of steps (1001, 1002, 1003, 1004 and 1005).

Figure 25:
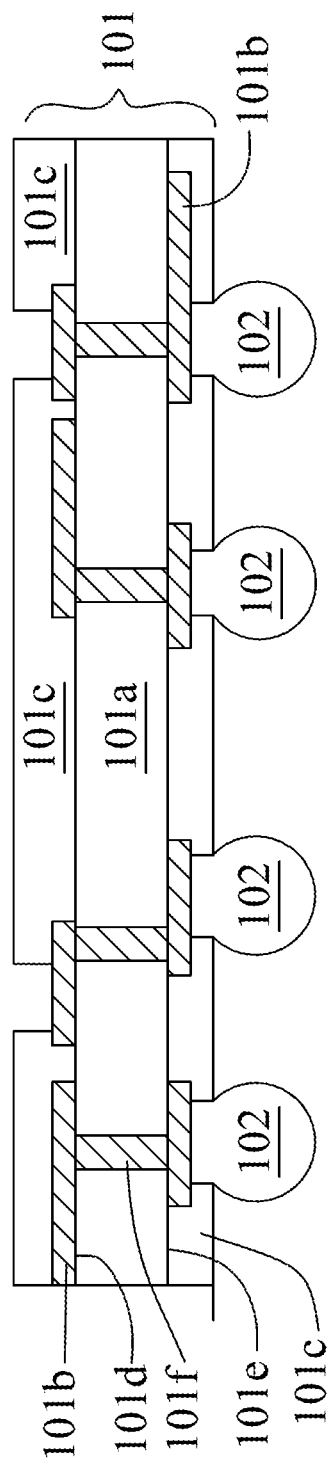
FIGS. 25 to 29 are schematic views of manufacturing the sixth semiconductor structure by the method of FIG. 24 in accordance with some embodiments of the present disclosure.

In step 1001, a packaging substrate 101 is provided as shown in FIG. 25. In some embodiments, the packaging substrate 101 includes a substrate 101a, a conductive trace 101b and a protective layer 101c, which have configurations similar to those described above or shown in FIG. 6.

Figure 26:
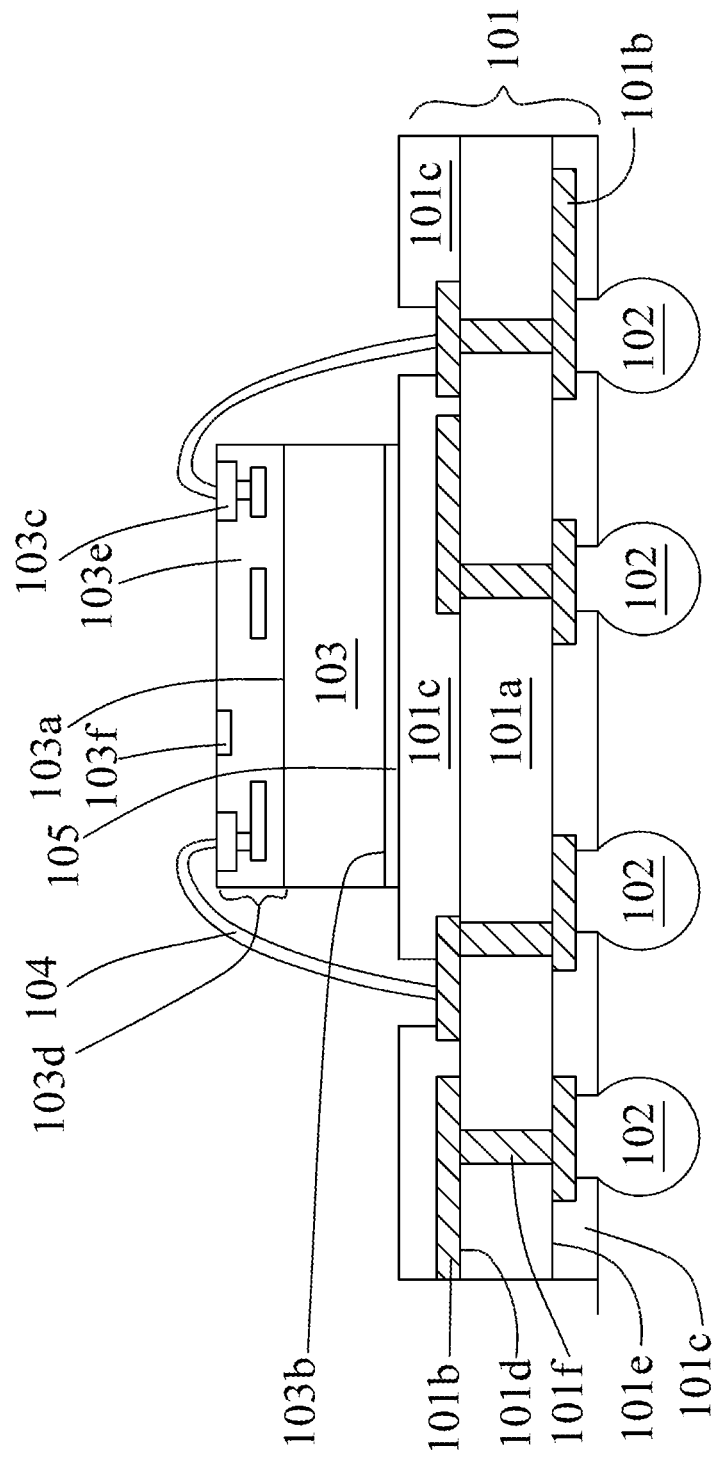

In step 1002, a die 103 is bonded over the packaging substrate 101 as shown in FIG. 26. In some embodiments, a redistribution layer (RDL) 103d including a dielectric layer 103e and an interconnect structure 103f is formed over the die 103. In some embodiments, the die 103 has configurations similar to those described above or shown in FIG. 6.

In some embodiments, the die 103 is attached to the protective layer 101c of the packaging substrate 101 by an adhesive 105, and the die 103 is electrically connected to the packaging substrate 101 by wire bonding operations. In some embodiments, the interconnect structure 103f of the RDL 103d of the die 103 is electrically connected to a conductive trace 101b of the packaging substrate 101 through a bonding wire 104.

Figure 27:
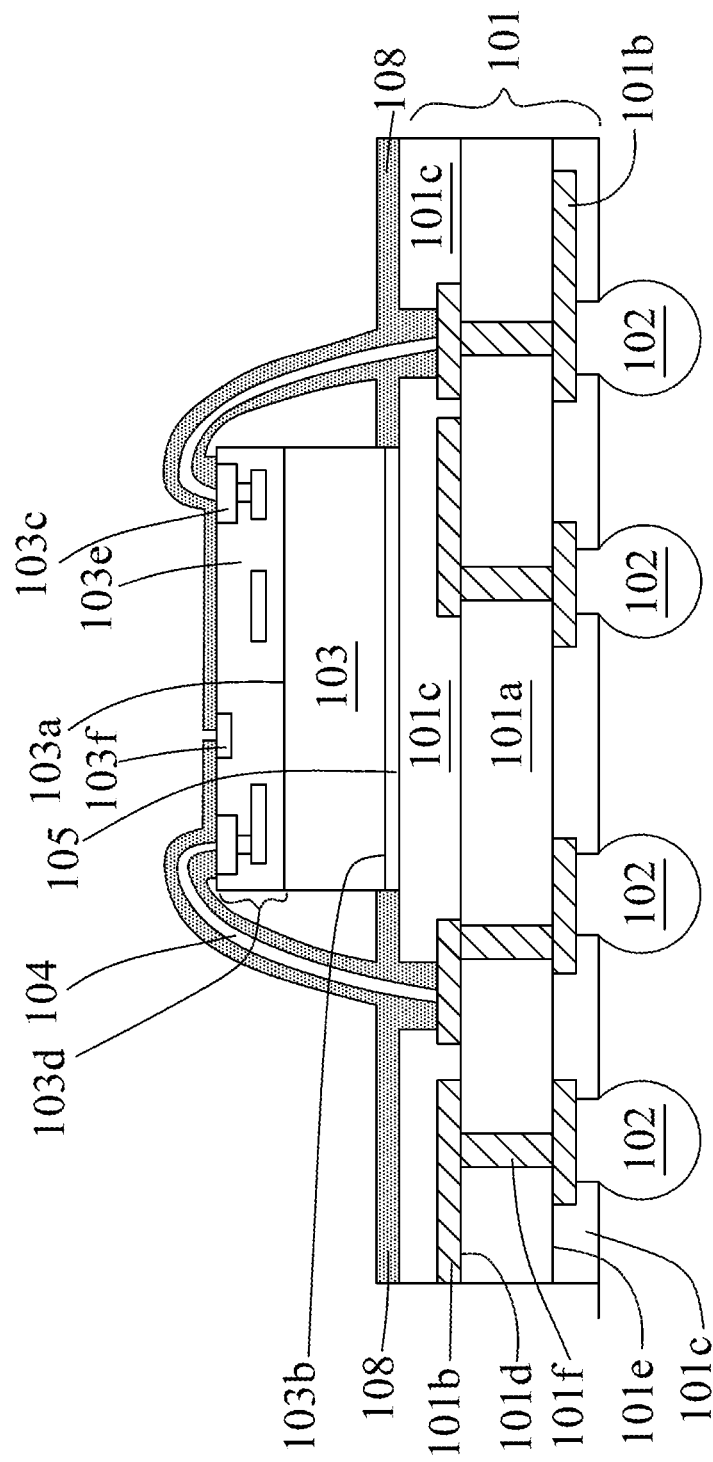

In step 1003, an insulating layer 108 is disposed over the die 103 and the packaging substrate 101 as shown in FIG. 27. In some embodiments, the insulating layer 108 is disposed over the protective layer 101c and the RDL 103d and encapsulates the bonding wire 104. In some embodiments, a portion of the insulating layer 108 is next removed by etching, drilling or any other suitable operation, so as to expose a portion of the interconnect structure 103f In some embodiments, the insulating layer 108 has configurations similar to those described above or shown in FIG. 6.

Figure 28:
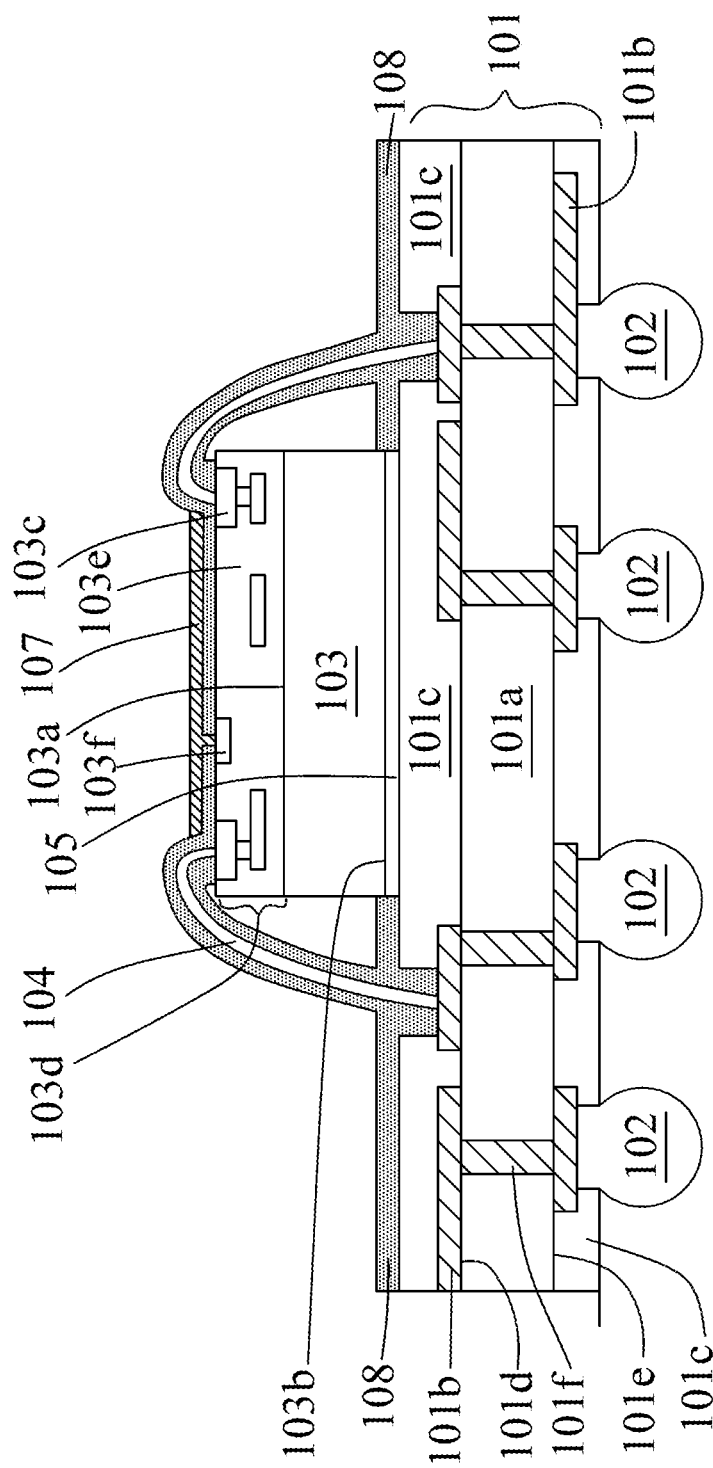

In step 1004, a metallic layer 107 is disposed over the insulating layer 108 as shown in FIG. 28. In some embodiments, the metallic layer 107 is disposed over the RDL 103d of the die 103. In some embodiments, the metallic layer 107 is disposed by sputtering, electroplating or any other suitable operation. In some embodiments, the metallic layer 107 is in contact with the portion of the interconnect structure 103f exposed through the insulating layer 108, such that the metallic layer 107 is electrically connected to the interconnect structure 103f. In some embodiments, the interconnect structure 103f and the metallic layer 107 are electrically connected to an electrical ground and thus are grounded. In some embodiments, the metallic layer 107 has configurations similar to those described above or shown in FIG. 6.

Figure 29:
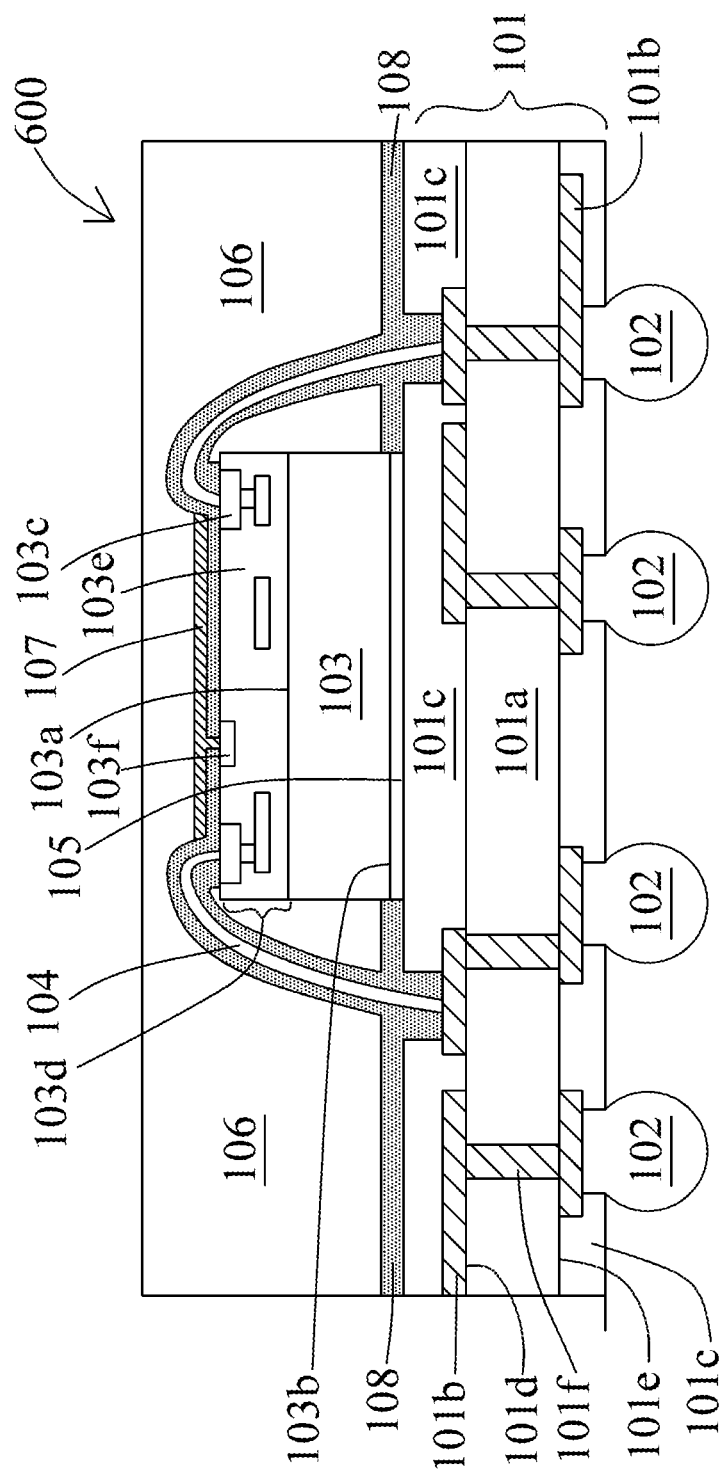

In step 1005, a molding 106 is formed as shown in FIG. 29. In some embodiments, the molding 106 is disposed over the insulating layer 108 and the metallic layer 107 and the molding 106 surrounds the die 103. In some embodiments, the molding 106 is formed by compression molding, transfer molding or any other suitable operation. In some embodiments, the molding 106 has configurations similar to those described above or shown in FIG. 6. In some embodiments, the sixth semiconductor structure 600 as shown in FIG. 6 is formed.

Figure 30:
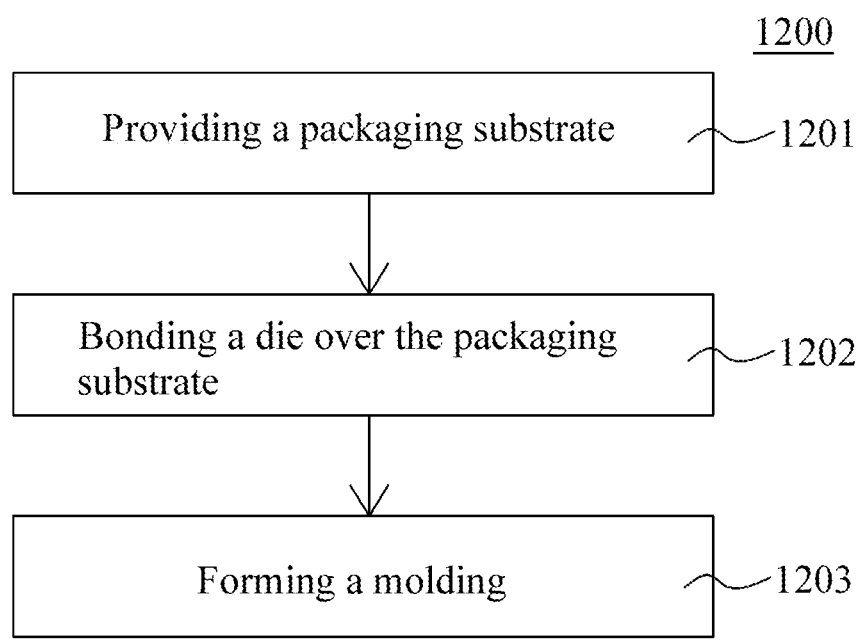
FIG. 30 is a flowchart of a method of manufacturing a seventh semiconductor structure in accordance with some embodiments of the present disclosure.

In the present disclosure, a method of manufacturing a semiconductor structure is also disclosed. In some embodiments, a seventh semiconductor structure 700 can be formed by a method 1200 as shown in FIG. 30. The method 1200 includes a number of operations and the description and illustration are not deemed as a limitation to the sequence of the operations. The method 1200 includes a number of steps (1201, 1202 and 1203).

Figure 31:
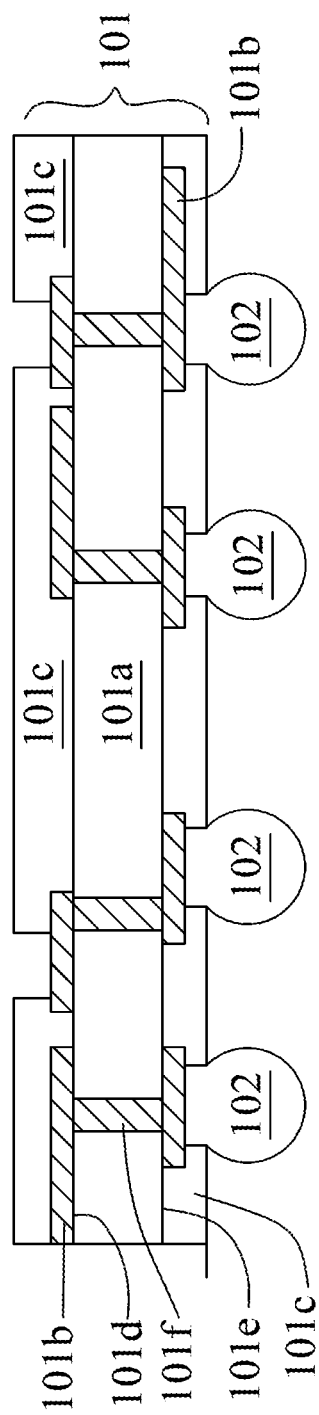
FIGS. 31 to 33 are schematic views of manufacturing the seventh semiconductor structure by the method of FIG. 30 in accordance with some embodiments of the present disclosure.

In step 1201, a packaging substrate 101 is provided as shown in FIG. 31. In some embodiments, the packaging substrate 101 includes a substrate 101a, a conductive trace 101b and a protective layer 101c, which have configurations similar to those described above or shown in FIG. 7.

Figure 32:
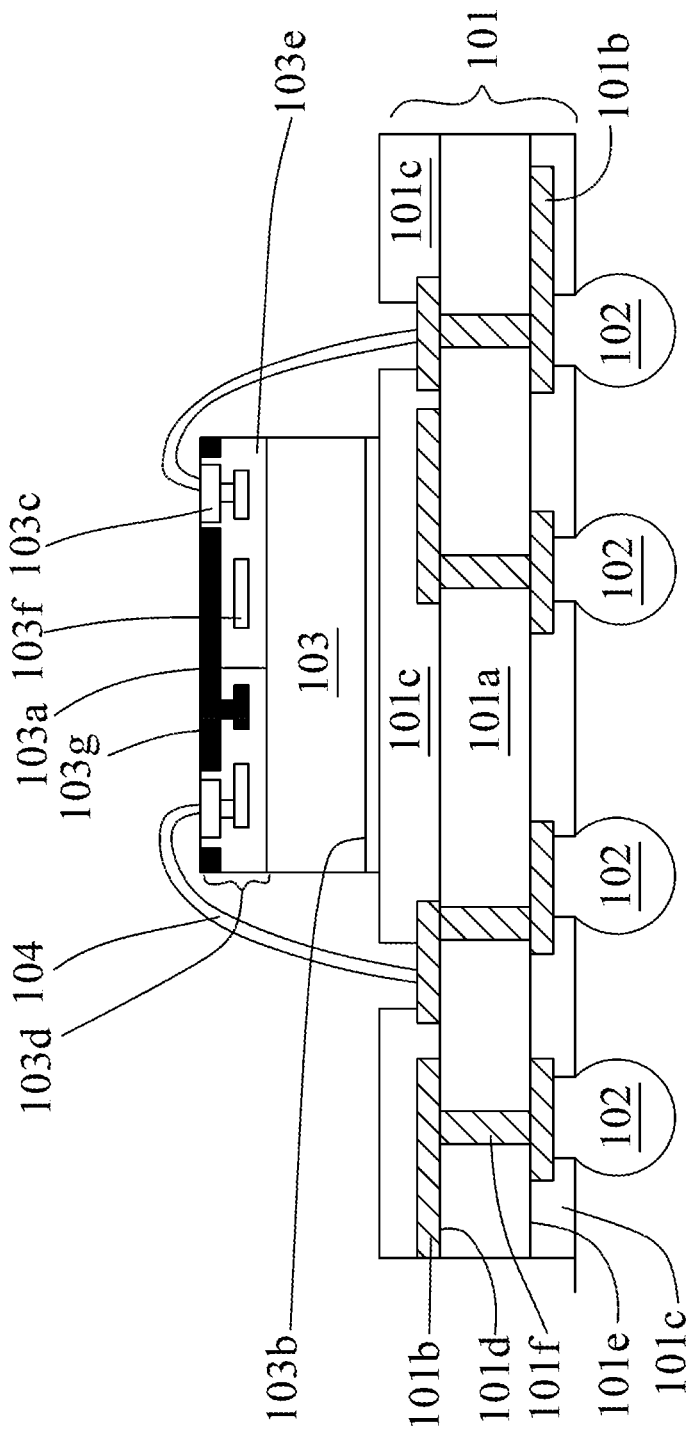

In step 1202, a die 103 is bonded over the packaging substrate 101 as shown in FIG. 32. In some embodiments, a redistribution layer (RDL) 103d including a dielectric layer 103e and an interconnect structure 103f is formed over the die 103. In some embodiments, the formation of the interconnect structure 103f of the RDL 103d includes forming a conductive plane 103g surrounded by and at least partially exposed from the dielectric layer 103e. In some embodiments, the die 103 has configurations similar to those described above or shown in FIG. 7.

In some embodiments, the die 103 is attached to the protective layer 101c of the packaging substrate 101 by an adhesive 105, and the die 103 is electrically connected to the packaging substrate 101 by wire bonding operations. In some embodiments, the interconnect structure 103f of the RDL 103d is electrically connected to a conductive trace 101b of the packaging substrate 101 through a bonding wire 104. In some embodiments, the conductive plane 103g is a grounded plane or is connected to an electrical ground.

Figure 33:
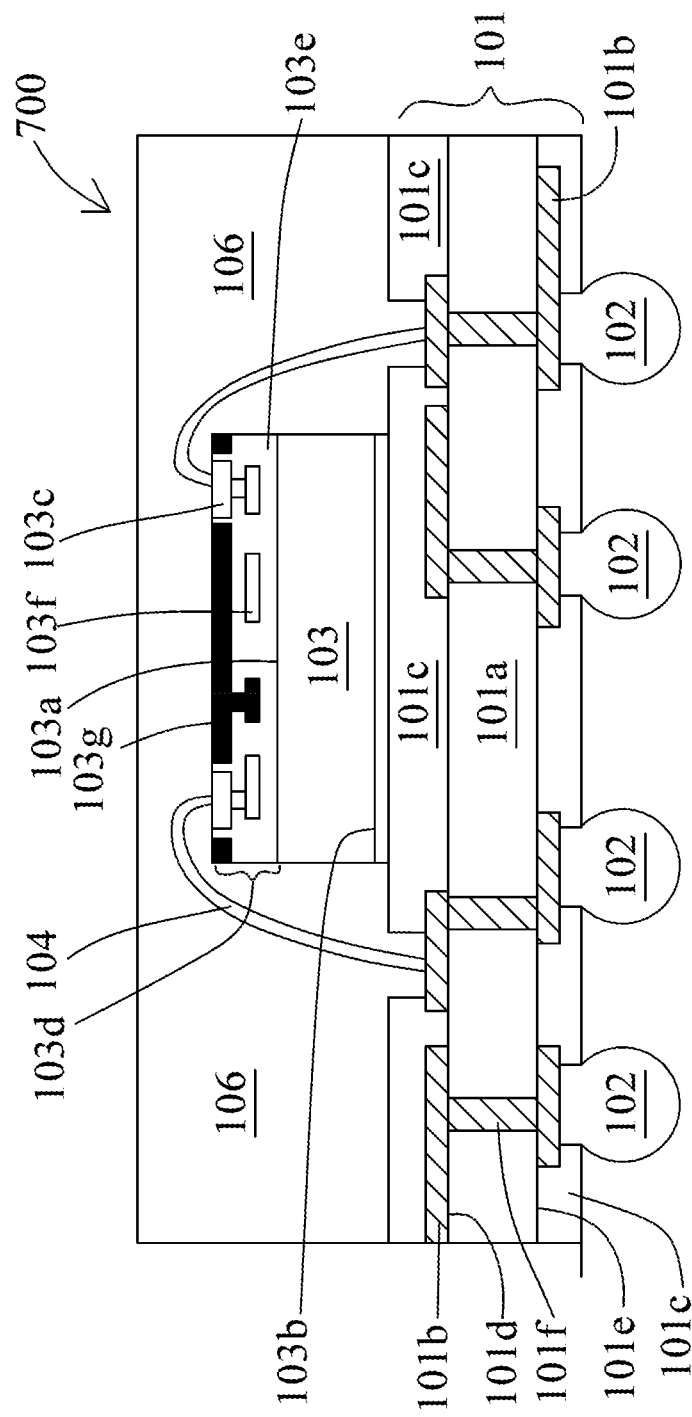

In step 1203, a molding 106 is formed as shown in FIG. 33. In some embodiments, the molding 106 is disposed over the substrate 101 and surrounds the die 103. In some embodiments, the molding 106 is formed by compression molding, transfer molding or any other suitable operation. In some embodiments, the molding 106 has configurations similar to those described above or shown in FIG. 7. In some embodiments, the seventh semiconductor structure 700 as shown in FIG. 7 is formed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
a substrate including a first surface, a second surface opposite to the first surface, a first conductive trace disposed over and in contact with the first surface, a second conductive trace disposed over and in contact with the first surface, and a third conductive trace extending and disposed over the second surface of the substrate;
a die disposed over the first surface of the substrate;
a molding disposed over the first surface of the substrate and covering the die; and
a metallic layer surrounding the molding and the substrate,
wherein the metallic layer is electrically connected to a portion of the first conductive trace exposed through the substrate;
wherein a portion of the third conductive trace disposed on the second surface of the substrate is in contact with the metallic layer, and
wherein the first conductive trace is isolated from the die, the second conductive trace is electrically connected to the die, and the second conductive trace is not in contact with the metallic layer.

2. The semiconductor structure of claim 1, wherein the portion of the first conductive trace is exposed through a sidewall of the substrate.

3. The semiconductor structure of claim 1, wherein the third conductive trace and the metallic layer are connected to an electrical ground.

4. The semiconductor structure of claim 1, wherein the metallic layer is conformal to an outer surface of the molding and a sidewall of the substrate.

5. The semiconductor structure of claim 1, wherein the die is attached to the first surface of the substrate by an adhesive.

6. The semiconductor structure of claim 1, wherein the die is electrically connected to the substrate by a bonding wire.

7. The semiconductor structure of claim 1, further comprising a conductive bump disposed over the second surface of the substrate opposite to the first surface.

* * * * *